(12) United States Patent
Nozaki et al.

(10) Patent No.: US 7,625,688 B2
(45) Date of Patent: *Dec. 1, 2009

(54) RESIST PATTERN THICKENING MATERIAL, RESIST PATTERN AND PROCESS FOR FORMING THE SAME, AND SEMICONDUCTOR DEVICE AND PROCESS FOR MANUFACTURING THE SAME

(75) Inventors: Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/283,720

(22) Filed: Nov. 22, 2005

(65) Prior Publication Data
US 2006/0073420 A1 Apr. 6, 2006

Related U.S. Application Data

(63) Continuation of application No. 10/623,679, filed on Jul. 22, 2003.

(30) Foreign Application Priority Data
Jul. 25, 2002 (JP) ............................. 2002-217213

(51) Int. Cl.
G03F 7/00 (2006.01)
G03F 7/004 (2006.01)

(52) U.S. Cl. ............... 430/270.1; 430/273.1; 430/313; 430/330; 430/331

(58) Field of Classification Search ............... 430/270.1, 430/313
See application file for complete search history.

(56) References Cited

U.S. PATENT DOCUMENTS 4,113,650 A * 9/1978 Putman et al. ............ 252/363.5

(Continued)

FOREIGN PATENT DOCUMENTS

DE 19814142 10/1998

(Continued)

OTHER PUBLICATIONS

English language abstract of JP 2001-019860.*

(Continued)

*Primary Examiner*—Amanda C. Walke
(74) *Attorney, Agent, or Firm*—Westerman, Hattori, Daniels & Adrian, LLP

(57) ABSTRACT

The present invention provides a resist pattern thickening material and the like which can thicken a resist pattern and form a fine space pattern. The resist pattern thickening material contains: a resin; a crosslinking agent; and at least one type selected from cationic surfactants, amphoteric surfactants, and non-ionic surfactants selected from alkoxylate surfactants, fatty acid ester surfactants, amide surfactants, alcohol surfactants, and ethylene diamine surfactants. In a process for forming a resist pattern of the present invention, after a resist pattern is formed, the thickening material is applied onto a surface of the pattern. A process for manufacturing a semiconductor device of the present invention includes: after forming a resist pattern on an underlying layer, applying the thickening material on a surface of the pattern so as to thicken the pattern; and a step of patterning the underlying layer by etching by using the pattern.

35 Claims, 13 Drawing Sheets

U.S. PATENT DOCUMENTS

| | | | |
|---|---|---|---|
| 4,417,025 A * | 11/1983 | Toba et al. | 525/54.21 |
| 4,661,275 A | 4/1987 | Forsberg et al. | |
| 4,749,500 A | 6/1988 | Forsberg et al. | |
| 5,055,342 A | 10/1991 | Markovich et al. | |
| 5,858,620 A | 1/1999 | Ishibashi et al. | |
| 5,955,241 A | 9/1999 | Sato et al. | |
| 6,083,658 A | 7/2000 | Kunita et al. | |
| 6,214,518 B1 | 4/2001 | Kunita et al. | |
| 6,300,032 B1 | 10/2001 | Van Damme et al. | |
| 6,319,853 B1 | 11/2001 | Ishibashi et al. | |
| 6,329,119 B1 * | 12/2001 | Suetsugu et al. | 430/270.1 |
| 6,368,774 B1 | 4/2002 | Sakurai et al. | |
| 6,403,283 B1 | 6/2002 | Aoshima et al. | |
| 6,416,939 B1 * | 7/2002 | Shimada et al. | 430/325 |
| 6,555,607 B1 | 4/2003 | Kanda et al. | |
| 6,579,657 B1 * | 6/2003 | Ishibashi et al. | 430/270.1 |
| 6,593,063 B1 | 7/2003 | Tanaka et al. | |
| 2002/0037476 A1 | 3/2002 | Kamijima | |

FOREIGN PATENT DOCUMENTS

| | | |
|---|---|---|
| DE | 10014083 | 3/2001 |
| EP | 1152036 | 11/2001 |
| EP | 1223470 | 7/2002 |
| EP | 1315043 | 5/2003 |
| EP | 1343052 | 9/2003 |
| JP | 05-197151 | 8/1993 |
| JP | 10-73927 | 3/1998 |
| JP | 11-204399 | 7/1999 |
| JP | 11-283910 | 10/1999 |
| JP | 2000-298356 | 10/2000 |
| JP | 2000-347414 | 12/2000 |
| JP | 2001-19860 | 1/2001 |
| JP | 2001019860 A * | 1/2001 |
| JP | 200133984 | 2/2001 |
| JP | 2001-66782 | 3/2001 |
| JP | 2001-228616 | 8/2001 |
| JP | 2002-6491 | 1/2002 |
| JP | 2002-49161 | 2/2002 |
| WO | WO 02/10858 | 2/2002 |
| WO | WO 03/014830 | 2/2003 |

OTHER PUBLICATIONS

Japanese Office Action dated Feb. 7, 2006 of a corresponding Japanese Application.

Takeo Ishibashi, et al.; Advanced Micro-Lithography Process with Chemical Shrink Technology; Japanese Journal of Applied Physics, vol. 40, Part 1, No. 1, pp. 419-425; Jan. 2001.

Mamoru Terai, et al.; Below 70-nm Contact Hole Pattern with RELACS Process on ArF Resist; Advanced Technology R&D Center, Mitsubishi Electric.

Mamoru Terai, et al.; Newly Developed Resolution Enhancement Lithography Assisted by Chemical Shrink Process and Materials for Next-Generation Devices; Japanese Journal of Applied Physics, vol. 45, No. 6B, pp. 5354-5358; 2006.

* cited by examiner crosslinking baking development with water

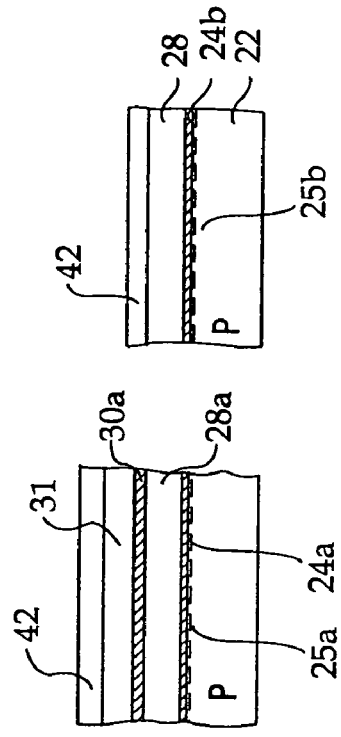
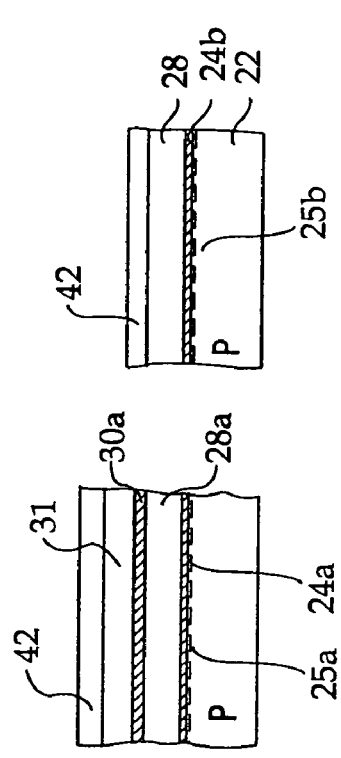
FIG. 7A
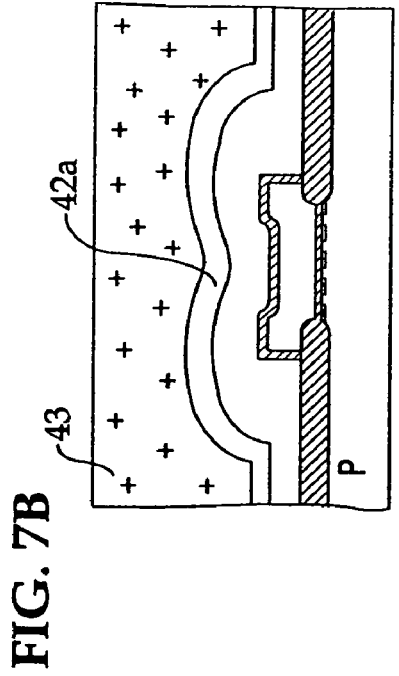
FIG. 7B
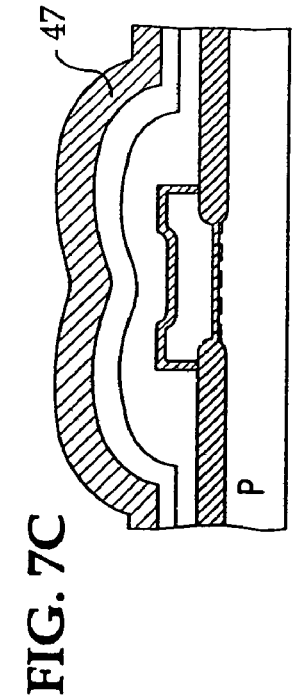
FIG. 7C

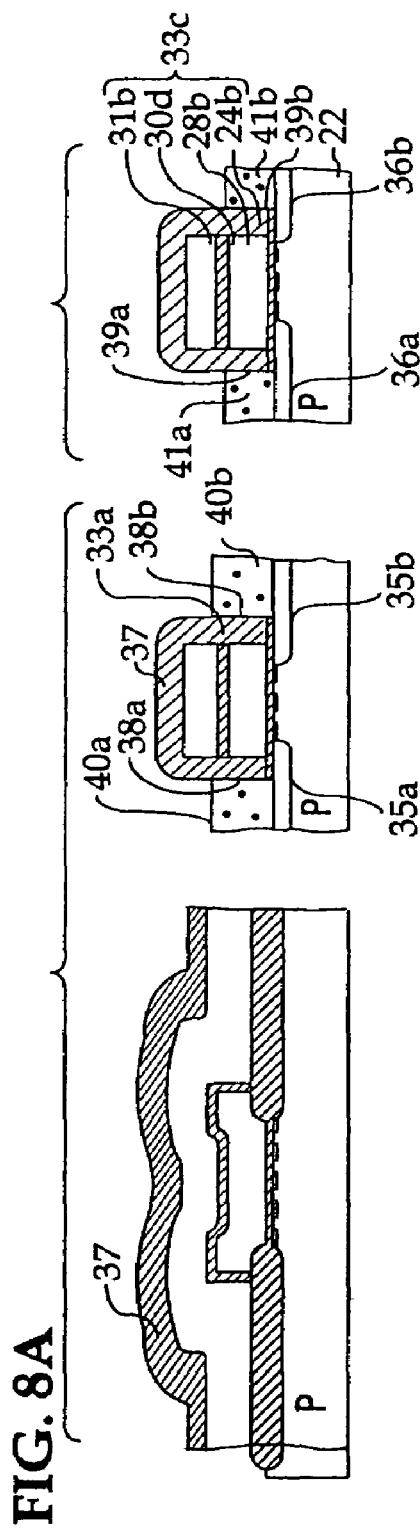
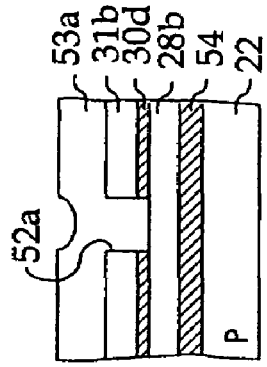
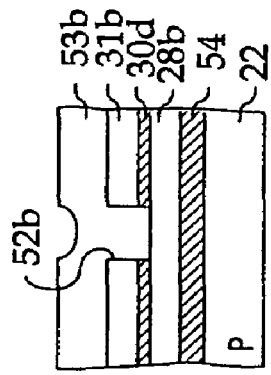
FIG. 8A
FIG. 8B
FIG. 8C

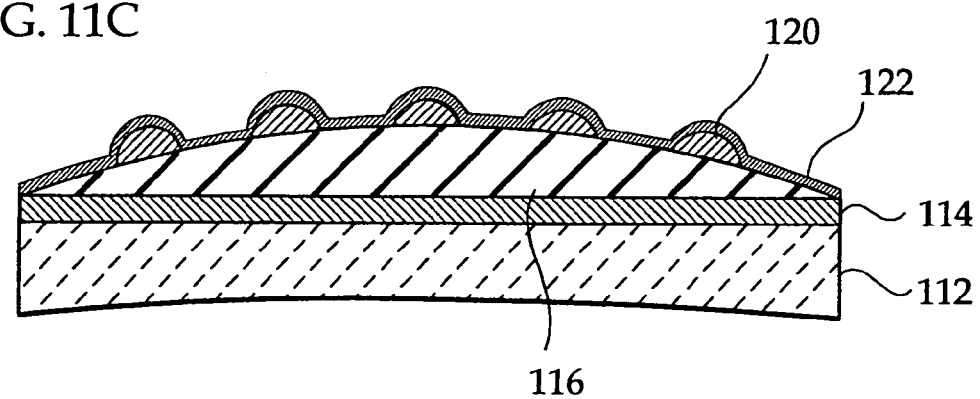
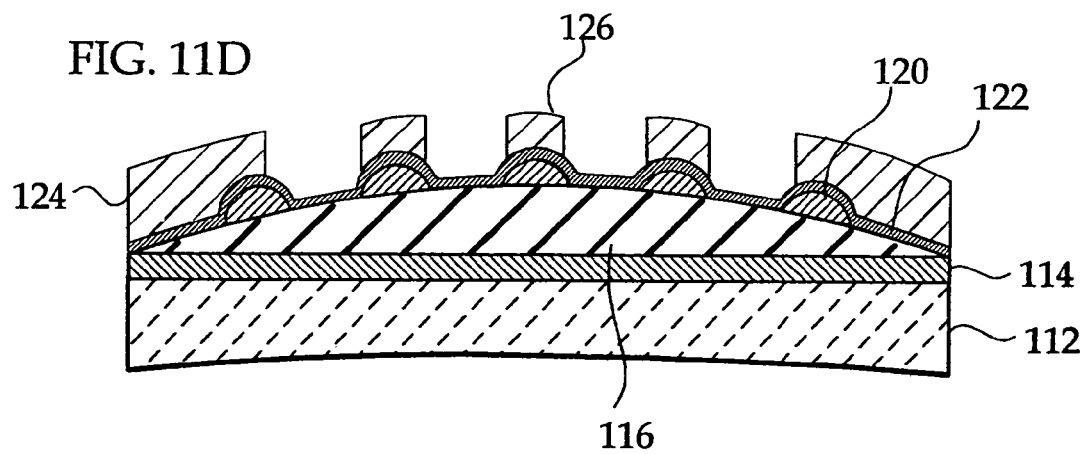

RESIST PATTERN THICKENING MATERIAL, RESIST PATTERN AND PROCESS FOR FORMING THE SAME, AND SEMICONDUCTOR DEVICE AND PROCESS FOR MANUFACTURING THE SAME

CROSS-REFERENCE TO RELATED APPLICATIONS

This application is based upon and claims the benefit of priority from the prior Japanese Patent Application No. 2002-217213, filed on Jul. 25, 2002, the entire contents of which are incorporated herein by reference. This application is a continuation application of prior application Ser. No. 10/623,679 filed on Jul. 22, 2003.

BACKGROUND OF THE INVENTION

1. Field of the Invention

The present invention relates to a resist pattern thickening material which is applied onto a resist pattern and thickens the resist pattern, and which can form a fine space pattern exceeding exposure limits of light sources of existing exposure devices ("space pattern" is hereby defined as a hole, trench, recess, or any other empty space that is formed by a developed (removed) resist). The present invention also relates to a resist pattern, a process for forming the resist pattern, a semiconductor device, and a process for manufacturing the semiconductor device, all of which use the resist pattern thickening material.

2. Description of the Related Art

Conventionally, in manufacturing a semiconductor device, a hole pattern or a line-and-space pattern is formed by using a resist material. In recent years, there has been line-and-space pattern is formed by using a resist material. In recent years, there has been much research and development of techniques for thickening the resist pattern forming the portions other than the holes in the hole pattern or the line portions in the line-and-space pattern, so as to make the space pattern corresponding to the hole portions in the hole pattern or to the space portions in the line-and-space pattern (i.e., the space pattern formed by the resist pattern) extremely fine. As space patterns have become increasingly fine, the exposure light needed at the time of forming the pattern has changed from lights such as visible light, laser light and the like, to X-rays and electron beams. However, from the standpoint of maintaining good mass produceability, there is a strong demand in continuing to use light (e.g., visible light, laser light and the like) as the exposure light when forming fine patterns. Thus, the development of a method which can efficiently form fine patterns by using deep ultraviolet light, which is light of a short wavelength, as the exposure light has been desired.

Japanese Patent Application Laid-Open (JP-A) No. 10-73927 discloses a technique called RELACS for making a space pattern finer. This technique can form a fine space pattern by using KrF (krypton fluoride) excimer laser (wavelength: 248 nm) which is deep ultraviolet light, as the exposure light of a photoresist (which will hereinafter simply be called "resist"). In this technique, a resist pattern is formed by exposing a resist (a positive resist or a negative resist) to light by using a KrF (krypton fluoride) excimer laser (wavelength: 248 nm) as the exposure light. Thereafter, by using a water-soluble resin composition, an applied film is provided so as to cover the resist pattern. The applied film and the resist pattern are made to interact at the interface thereof by using the residual acid within the material of the resist pattern, and the resist pattern is thickened. (Hereinafter, this thickening of the resist pattern will be referred to upon occasion as "swelling".) In this way, the distance between the resist patterns is shortened, and a fine space pattern is formed. In accordance with this technique, if a hole pattern is used for example, it is possible to form a fine hole pattern exceeding the exposure limit.

In recent years, the practical application of ArF (argon fluoride) excimer laser (wavelength: 193 nm) as the next-generation exposure light in place of KrF (krypton fluoride) excimer laser (wavelength: 248 nm) has advanced. However, in the above-described technique, it is not possible to use ArF excimer laser as the exposure light, instead of KrF excimer laser. The reason for this is as follows. A resist which is used for KrF excimer laser (hereinafter called a "KrF resist"), which is used as the resist in the above-described technique, is an aromatic resin compound such as a novolak resin, naphthoquinone diazide, or the like. The aromatic rings contained in the aromatic resin compound strongly absorb ArF excimer laser. Thus, even if KrF excimer laser is merely replaced with ArF excimer laser as the exposure light in the above-described technique, the ArF excimer laser cannot pass through the film of the KrF resist. Thus, in the above-described technique, when ArF excimer laser or light of an even shorter wavelength is used as the exposure light, a KrF resist cannot be used, and a resist which is used for an ArF excimer laser (hereinafter called an "ArF resist") which does not contain aromatic rings must be used.

However, using an ArF resist as the resist in the above-described technique, a problem arises in that the resist pattern cannot be thickened efficiently.

Therefore, the current situation is that there has not yet been developed techniques such as materials, methods and the like which, after forming a resist pattern by using ArF excimer laser as well as KrF excimer laser as the exposure light, can form an applied film on the resist pattern and thicken the resist pattern. The development of such techniques has been desired.

SUMMARY OF THE INVENTION

An object of the present invention is to provide a resist pattern thickening material which, when applied on a resist pattern, can efficiently thicken the resist pattern, and which is suited to formation of a fine space pattern, exceeding the exposure limits of light sources of existing exposure devices.

Another object of the present invention is to provide a process for forming a resist pattern which, when patterning a resist pattern, can utilize, as is, light sources (such as ArF excimer laser light or the like) of existing exposure devices, and which has excellent mass productivity, and which can form a space pattern finely, exceeding the exposure limits of such light sources, and to provide a resist pattern formed by this process for forming a resist pattern.

Yet another object of the present invention is to provide a process for manufacturing a semiconductor device which, by using a fine space pattern formed by the resist pattern, can form a fine pattern on an underlying layer which is an oxide film or the like, and which can efficiently mass produce high-performance semiconductor devices having fine wiring and the like, and to provide a high-performance semiconductor device manufactured by this process for manufacturing a semiconductor device.

The resist pattern thickening material of the present invention comprises: a resin; a crosslinking agent; and at least one of a cationic surfactant, an amphoteric surfactant, and a non-ionic surfactant selected from an alkoxylate surfactant, a fatty acid ester surfactant, an amide surfactants, an alcohol surfactants, and an ethylene diamine surfactant.

The resist pattern of the present invention is formed by, after a resist pattern is formed, the resist pattern thickening material of the present invention being applied so as to cover a surface of the resist pattern.

In the process for forming a resist pattern of the present invention, after a resist pattern is formed, the resist pattern thickening material of the present invention is applied so as to cover a surface of the resist pattern.

The semiconductor device of the present invention has a pattern formed by using the resist pattern thickening material of the present invention.

The process for manufacturing a semiconductor device of the present invention comprises steps of: applying a resist pattern thickening material to cover a surface of a resist pattern to be thickened, after forming the resist pattern to be thickened on an underlying layer, so as to thicken the resist pattern to be thickened and form a resist pattern; and etching the underlying layer using the resist pattern as a mask so as to pattern the underlying layer.

BRIEF DESCRIPTION OF THE DRAWINGS

FIGS. 7A to 7C are cross-sectional schematic diagrams for explaining a process for manufacturing a FLASH EPROM which is another example of a process for manufacturing a semiconductor device of the present invention.

FIGS. 8A to 8C are cross-sectional schematic diagrams for explaining a process for manufacturing a FLASH EPROM which is another example of a process of manufacturing a semiconductor device of the present invention.

FIGS. 11C to 11D are cross-sectional schematic diagrams for explaining part 3 and 4 of the process of the other example in which the resist pattern, which has been thickened by using the resist pattern thickening material of the present invention, is applied to the manufacturing of the recording head.

Figure 1A:
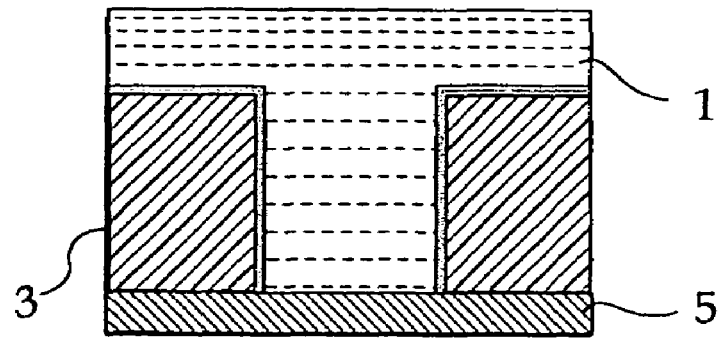
FIGS. 1A to 1C are schematic diagrams for explaining one example of the mechanism of thickening a resist pattern by using a resist pattern thickening material of the present invention.

DESCRIPTION OF THE PREFERRED EMBODIMENTS (Resist Pattern Thickening Material)

The resist pattern thickening material of the present invention comprises a resin; a crosslinking agent; and at least one of a cationic surfactant, an amphoteric surfactant, and a nonionic surfactants selected from an alkoxylate surfactant, a fatty acid ester surfactant, an amide surfactant, an alcohol surfactant, and an ethylene diamine surfactant. As needed, the resist pattern thickening material may also include a water-soluble aromatic compound, a resin containing an aromatic compound in a portion thereof, an organic solvent, and/or other components which are appropriately selected.

When the resist pattern thickening material of the present invention is applied on an initial resist pattern (which may be also referred as "a resist pattern to be thickened" hereinafter), the portion of the applied resist pattern thickening material which is in a vicinity of the interface with the initial resist pattern (the resist pattern to be thickened) seeps into the initial resist pattern (the resist pattern to be thickened) and crosslinks with the material of the initial resist pattern (the resist pattern to be thickened). At this time, because the affinity of the resist pattern thickening material and the initial resist pattern (the resist pattern to be thickened) is good, a surface layer, in which the resist pattern thickening material and the initial resist pattern (the resist pattern to be thickened) have become integral, is efficiently formed on the surface of the initial resist pattern (the resist pattern to be thickened), so that the initial resist pattern (the resist pattern to be thickened) becomes an inner layer. (Namely, the resist pattern to be thickened is efficiently thickened by the resist pattern thickening material.) The resist pattern which is formed in this way has been thickened by the resist pattern thickening material. Thus, a space pattern formed by the resist pattern exceeds exposure limits and has an even more fine structure.

The resist pattern thickening material of the present invention is water-soluble or alkali-soluble.

The resist pattern thickening material of the present invention may be an aqueous solution, a colloid liquid or an emulsion liquid or the like. Of these, an aqueous solution is preferable.

—Resin—

The resin is not particularly limited, and can be appropriately selected in accordance with the object. However, it is preferable that the resin is water-soluble or alkali-soluble. It is more preferable that the resin can generate a crosslinking reaction, or that the resin cannot generate a crosslinking reaction but can mix together with a water-soluble crosslinking agent. Examples thereof include polyvinyl alcohol, polyvinyl acetal, polyvinyl acetate, polyacrylic acid, polyvinyl pyrrolidone, polyethyleneimine, polyethylene oxide, styrene-maleic acid copolymer, polyvinyl amine, polyaryl amine, oxazoline group containing water-soluble resins, water-soluble melamine resins, water-soluble urea resins, alkyd resins, sulfonamide resins, and the like.

These may be used singly, or in combination of two or more. Among these, polyvinyl alcohol, polyvinyl acetal, polyvinyl acetate, and the like are preferable. In the present invention, it is preferable that the resin contains polyvinyl acetal. From the standpoint of being able to easily change the solubility by the crosslinking, the resin more preferably contains polyvinyl acetal in an amount of 5% by mass to 40% by mass.

The content of the resin in the resist pattern thickening material differs in accordance with the type, the content and the like of the crosslinking agent, the water-soluble aromatic compound and the like, and cannot be stipulated unconditionally, and can be appropriately selected in accordance with the object.

—Crosslinking Agent—

The crosslinking agent is not particularly limited, and can be appropriately selected in accordance with the object. However, water-soluble crosslinking agents which cause crosslinking due to heat or an acid are preferable. Amino crosslinking agents are suitable examples.

Suitable examples of the amino crosslinking agents are melamine derivatives, urea derivatives, uril derivatives, and the like. These may be used singly, or in combination of two or more.

Examples of the urea derivatives include urea, alkoxymethylene urea, N-alkoxymethylene urea, ethylene urea, ethylene urea carboxylic acid, derivatives thereof, and the like.

Examples of the melamine derivatives include alkoxymethyl melamine, derivatives thereof, and the like.

Examples of the uril derivatives include benzoguanamine, glycol uril, derivatives thereof, and the like.

The content of the crosslinking agent in the resist pattern thickening material differs in accordance with the type, the content and the like of the resin and the like, and cannot be stipulated unconditionally, and can be appropriately selected in accordance with the object.

—Cationic Surfactant—

The cationic surfactant is not particularly limited and can be appropriately selected in accordance with the object. Examples thereof include alkyl cationic surfactants, amide type quaternary cationic surfactants, ester type quaternary cationic surfactants, and the like.

—Amphoteric Surfactant—

The amphoteric surfactant is not particularly limited and can be appropriately selected in accordance with the object. Examples thereof include amine oxide surfactants, betaine surfactants, and the like.

—Non-Ionic Surfactant—

Suitable examples of non-ionic surfactants include surfactants selected from among alkoxylate surfactants, fatty acid ester surfactants, amide surfactants, alcohol surfactants, and ethylene diamene surfactants. Specific examples thereof include polyoxyethylene-polyoxypropylene condensation products, polyoxyalkylene alkylether compounds, polyoxyethylene alkylether compounds, polyoxyethylene derivatives, sorbitan fatty acid ester compounds, glycerin fatty acid ester compounds, primary alcohol ethoxylate compounds, phenol ethoxylate compounds, and nonylphenol ethoxylate surfactants, octylphenol ethoxylate surfactants, lauryl alcohol ethoxylate surfactants, oleyl alcohol ethoxylate surfactants, fatty acid ester surfactants, amide surfactants, natural alcohol surfactants, ethylene diamine surfactants, and secondary alcohol ethoxylate surfactants, and the like.

These may be used singly, or in combination of two or more. The content of the surfactant in the resist pattern thickening material can be appropriately selected in accordance with the type, the content, and the like of the resin, the crosslinking agent and the like.

—Water-Soluble Aromatic Compound—

From the standpoint of markedly improving the etching resistance of the obtained resist pattern, the resist pattern thickening material preferably contains a water-soluble aromatic compound.

The water-soluble aromatic compound is not particularly limited provided that it is an aromatic compound and exhibits water solubility, and can be appropriately selected in accordance with the object. However, water-soluble aromatic compounds exhibiting water solubility of 1 g or more in 100 g of water of 25° C. are preferable, those exhibiting water solubility of 3 g or more in 100 g of water of 25° C. are more preferable, and those exhibiting water solubility of 5 g or more in 100 g of water of 25° C. are particularly preferable.

Examples of the water-soluble aromatic compounds are polyphenol compounds, aromatic carboxylic acid compounds, naphthalene polyhydroxy compounds, benzophenone compounds, flavonoid compounds, porphin, water-soluble phenoxy resins, aromatic-containing water-soluble dyes, derivatives thereof, glycosides thereof, and the like. These may be used singly, or in combination of two or more.

Examples of the polyphenol compounds and derivatives thereof include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, resorcinol, resorcinol [4] arene, pyrogallol, gallic acid, derivatives and glycosides thereof, and the like.

Examples of the aromatic carboxylic acid compounds and derivatives thereof include salicylic acid, phthalic acid, dihydroxy benzoic acid, tannin, derivatives and glycosides thereof, and the like.

Examples of the naphthalene polyhydroxy compounds and derivatives thereof include naphthalene diol, naphthalene triol, derivatives and glycosides thereof, and the like.

Examples of the benzophenone compounds and derivatives thereof include alizarin yellow A, derivatives and glycosides thereof, and the like.

Examples of the flavonoid compounds and derivatives thereof include flavone, isoflavone, flavanol, flavonone, flavonol, flavan-3-ol, aurone, chalcone, dihydrochalcone, quercetin, derivatives and glycosides thereof, and the like.

Among the aforementioned water-soluble aromatic compounds, from the standpoint of excellent water solubility, those having two or more polar groups are preferable, those having three or more polar groups are more preferable, and those having four or more polar groups are particularly preferable.

The polar groups are not particularly limited, and may be appropriately selected in accordance with the object. Examples include hydroxyl group, carboxyl group, carbonyl group, sulfonyl group, and the like.

The content of the water-soluble aromatic compound in the resist pattern thickening material can be appropriately determined in accordance with the type, the content, and the like of the resin, the crosslinking agent, and the like.

—Resin Containing an Aromatic Compound in a Portion Thereof—

From the standpoint of markedly improving the etching resistance of the obtained resist pattern, it is preferable that the resist pattern thickening material contains a resin containing an aromatic compound in a portion thereof.

The resin containing an aromatic compound in a portion thereof is not particularly limited and can be appropriately selected in accordance with the object. However, those which can generate a crosslinking reaction are preferable. Suitable examples include polyvinyl aryl acetal resins, polyvinyl aryl ether resins, polyvinyl aryl ester resins, and derivatives thereof. It is preferable to use at least one selected therefrom. From the standpoint of exhibiting water solubility or alkali solubility to an appropriate degree, such a resin which contains an acetyl group is more preferable. These may be used singly, or in combination of two or more.

The polyvinyl aryl acetal resin is not particularly limited and may be appropriately selected in accordance with the object. Examples thereof include β-resorcinol acetal and the like.

The polyvinyl aryl ether resin is not particularly limited and may be appropriately selected in accordance with the object. Examples thereof include 4-hydroxybenzyl ether and the like.

The polyvinyl aryl ester resin is not particularly limited and may be appropriately selected in accordance with the object. Examples thereof include benzoate and the like.

The method of producing the polyvinyl aryl acetal resin is not particularly limited and may be appropriately selected in accordance with the object. A suitable example is a known method of producing using a polyvinyl acetal reaction, or the like. Such a producing method is a method in which, for example, polyvinyl alcohol, and aldehyde in an amount needed stoichiometrically for the polyvinyl alcohol are made to undergo an acetalizing reaction in the presence of an acid catalyst. Specifically, suitable examples are the methods disclosed in U.S. Pat. Nos. 5,169,897 and 5,262,270, JP-A No. 5-78414, and the like.

The method of producing the polyvinyl aryl ether resin is not particularly limited and may be appropriately selected in accordance with the object. Examples thereof are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction of Williamson); and the like. Specifically, suitable examples are the methods disclosed in JP-A Nos. 2001-40086, 2001-181383, 6-116194, and the like.

The method of producing the polyvinyl aryl ester resin is not particularly limited and may be appropriately selected in accordance with the object. Examples thereof are a copolymerization reaction of a corresponding vinyl aryl ester monomer and vinyl acetate; an esterizing reaction of polyvinyl alcohol and an aromatic carboxylic acid halide compound in the presence of a basic catalyst; and the like.

The aromatic compound in the resin containing an aromatic compound in a portion thereof is not particularly limited, and may be appropriately selected in accordance with the object. Suitable examples include monocyclic aromatic compounds such as benzene derivatives, pyridine derivatives, and the like, and compounds in which a plurality of aromatic rings are connected (polycyclic aromatic compounds such as naphthalene, anthracene, and the like), and the like.

From the standpoint of appropriate water solubility, the aromatic compound in the resin containing an aromatic compound in a portion thereof preferably contains at least one functional group such as hydroxyl group, cyano group, alkoxyl group, carboxyl group, amino group, amide group, alkoxylcarbonyl group, hydroxyalkyl group, sulfonyl group, acid anhydride group, lactone group, cyanate group, isocyanate group, ketone group or the like, or a sugar derivative. It is more preferable for the aromatic compound to contain at least one functional group selected from hydroxyl group, amino group, sulfonyl group, carboxyl group, and derivatives thereof.

The molar content of the aromatic compound in the resin containing an aromatic compound in a portion thereof is not particularly limited provided that it does not affect the etching resistance, and can be appropriately selected in accordance with the object. However, when high etching resistance is required, the molar content is preferably 5 mol % or more, and 10 mol % or more is more preferable.

Note that the molar content of the aromatic compound in the resin containing an aromatic compound in a portion thereof can be measured by using NMR or the like for example.

The content, in the resist pattern thickening material, of the resin containing an aromatic compound in a portion thereof, can be appropriately determined in accordance with the type, the content and the like of the resin, the crosslinking agent, and the like.

—Organic Solvent—

By making the resist pattern thickening material contain an organic solvent, the solubility of the resin, the crosslinking agent, the water-soluble aromatic compound, the resin containing an aromatic compound in a portion thereof, and the like in the resist pattern thickening material can be improved.

The organic solvent is not particularly limited, and can be appropriately selected in accordance with the object. Examples thereof include alcohol organic solvents, chain ester organic solvents, cyclic ester organic solvents, ketone organic solvents, chain ether organic solvents, cyclic ether organic solvents and the like.

Examples of the alcohols are methanol, ethanol, propyl alcohol, isopropyl alcohol, butyl alcohol, and the like.

Examples of the chain esters are ethyl lactate, propylene glycol methyl ether acetate (PGMEA), and the like.

Examples of the cyclic esters are lactone organic solvents such as γ-butyrolactone, and the like.

Examples of the ketones are acetone, cyclohexanone, heptanone, and the like.

Examples of the chain ethers are ethylene glycol dimethylether, and the like.

Examples of the cyclic ethers are tetrahydrofuran, dioxane, and the like.

These may be used singly, or in combination of two or more. Thereamong, organic solvents having a boiling point of around 80° C. to 200° C. are preferable from the standpoint of carrying out thickening accurately.

The content of the organic solvent in the resist pattern thickening material can be appropriately determined in accordance with the type, the content, and the like of the resin, the crosslinking agent, the water-soluble aromatic compound, the resin containing an aromatic compound in a portion thereof, the surfactant, and the like.

—Other Components—

The other components are not particularly limited provided that they do not adversely affect the effects of the present invention, and can be appropriately selected in accordance with the object. Examples thereof are various types of known additives such as thermal acid generating agents, quenchers such as amine type, amide type, ammonium chloride type quenchers, and the like.

The content of the other components in the resist pattern thickening material can be appropriately determined in accordance with the type, the content and the like of the resin, the surfactant, the crosslinking agent, the water-soluble aromatic compound, the resin containing an aromatic compound in a portion thereof, the organic solvent, and the like.

—Use—

The resist pattern thickening material can be used by being applied onto the resist pattern to be thickened.

At the time of applying, the surfactant may be applied before applying of the resist pattern thickening material, in which no surfactant is contained, or in which a surfactant is further contained.

When the resist pattern thickening material is applied onto and crosslinks with the resist pattern to be thickened, the resist pattern to be thickened thickens. A surface layer having excellent etching resistance is formed on the resist pattern to be thickened, and a resist pattern is formed. As a result, the diameter or width of a space pattern formed by the resist pattern is smaller than that of the former space pattern. Therefore an even finer space pattern is formed exceeding the exposure limit of the light source of the exposure device, which is used at the time of patterning the resist pattern to be thickened. In a case in which ArF excimer laser light is used at the time of patterning a resist pattern to be thickened, for example, when the obtained resist pattern to be thickened is thickened by using the resist pattern thickening material so as to form a resist pattern, a space pattern formed by the resist pattern is a fine space pattern which is similar to that obtained when patterning by using an electron beam.

It should be noted that, at this time, the amount of thickening of the resist pattern can be controlled to a desired degree by appropriately adjusting the viscosity of the resist pattern thickening material, the applying thickness of the resist pattern thickening material, the baking temperature, the baking time, and the like.

—Material of Resist Pattern to be Thickened—

The material of the resist pattern to be thickened (the resist pattern on which the resist pattern thickening material of the present invention is applied) is not particularly limited, and can be appropriately selected from among known resist materials in accordance with the object. The resist pattern to be thickened may be either of a negative type or a positive type resist pattern. Suitable examples thereof include g-line resists, i-line resists, KrF resists, ArF resists, $F_2$ resists, electron beam resists, and the like, which can be patterned by g-line, i-line, KrF excimer lasers, ArF excimer lasers, $F_2$ excimer lasers, electron beams, and the like, respectively. These resists may be chemically amplified types, or non-chemically amplified types. Among these, KrF resists, ArF resists, and the like are preferable, and ArF resists are more preferable.

The material of the resist pattern to be thickened is not particularly limited, and can be appropriately selected in accordance with the object. Examples thereof include novolak resists, polyhydroxystyrene (PHS) resists, acrylic resists, cycloolefin-maleic acid anhydride (COMA) resists, cycloolefin resists, hybrid (alicyclic acryl-COMA copolymer) resists, and the like. These materials may be fluorine-modified or the like.

The method of forming the resist pattern to be thickened, and the size, the thickness and the like of the resist pattern to be thickened are not particularly limited, and can be appropriately selected in accordance with the object. In particular, the thickness can be appropriately determined by the underlying layer which is the object of working, the etching conditions, and the like. However, the thickness is generally about 0.2 μm to 200 μm.

The thickening of the resist pattern to be thickened by using the resist pattern thickening material of the present invention will be described hereinafter with reference to the drawings.

As shown in FIG. 1A, after a resist pattern (a resist pattern to be thickened) 3 has been formed on an underlying layer (base) 5, a resist pattern thickening material 1 is applied onto the surface of the resist pattern (the resist pattern to be thickened) 3. Prebaking (heating and drying) is carried out, so that a film is formed. Then, mixing (impregnating) of the resist pattern thickening material 1 into the resist pattern (the resist pattern to be thickened) 3 occurs at the interface between the resist pattern (the resist pattern to be thickened) 3 and the resist pattern thickening material 1.

Figure 1B:
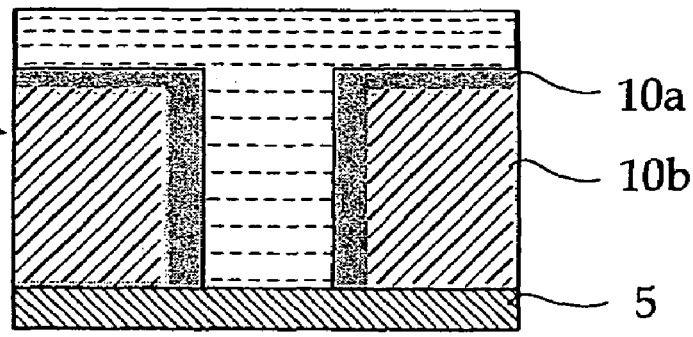

Here, as shown in FIG. 1B, when crosslinking baking (a crosslinking reaction) is carried out at a higher temperature than the temperature of the prebaking (heating and drying), the mixed (impregnated) portion at the interface of the resist pattern (the resist pattern to be thickened) 3 and the resist pattern thickening material 1 crosslinks.

Figure 1C:
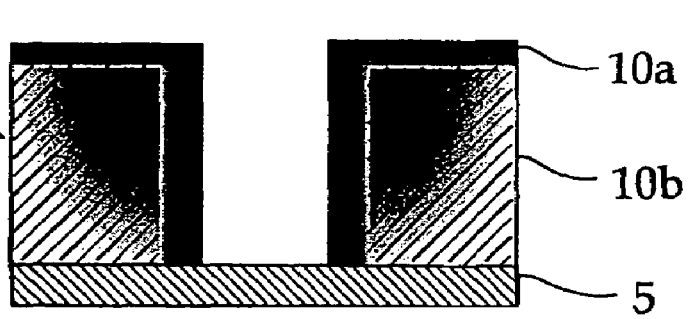

Thereafter, as shown in FIG. 1C, by carrying out developing processing, the portions, among the applied resist pattern thickening material 1, which have not crosslinked with the resist pattern (the resist pattern to be thickened) 3 or at which the crosslinking is weak (portions having high water solubility) are dissolved and removed, so that a resist pattern 10 is formed (developed).

The developing processing may be carried out in water or a weak alkali aqueous solution. However, water developing is preferable from the standpoint that the developing processing can be carried out efficiently at a low cost.

The resist pattern 10 has, on a surface of a resist pattern 10b (the resist pattern 3), a surface layer 10a which has been formed by the resist pattern thickening material 1 crosslinking on the resist pattern (the resist pattern to be thickened) 3. The resist pattern 10 is thicker than the resist pattern (the resist pattern to be thickened) 3 by an amount corresponding to the thickness of the surface layer 10a. Thus, the width of a space pattern formed by the resist pattern 10 is smaller than that of the former space pattern (the resist pattern to be thickened) 3, and the space pattern formed by the resist pattern 10 is particularly fine.

The surface layer 10a of the resist pattern 10 is formed by the resist pattern thickening material 1. In a case in which the resist pattern thickening material 1 contains at least one of an aromatic compound and a resin containing an aromatic compound in a portion thereof, even if the resist pattern (the resist pattern to be thickened) 3 is a material which has poor etching resistance, the resist pattern 10 which has on the surface thereof the surface layer 10a having excellent etching resistance, has markedly excellent etching resistance.

—Applications—

The resist pattern thickening material of the present invention can suitably be used in thickening a resist pattern which, at the time of patterning, can use not only KrF excimer laser light, but also ArF excimer laser light. Further, when the resist pattern thickening material contains at least one of an aromatic compound and a resin containing an aromatic compound in a portion thereof, the resist pattern thickening material can more suitably be used in covering and thickening patterns which are exposed to plasma or the like and which are formed of resin or the like whose surface etching resistance must be improved, and can particularly suitably be used in the resist pattern and the process for forming the same of the present invention, and in the semiconductor device and the process for manufacturing the same of the present invention.

(Resist Pattern)

The resist pattern of the present invention is the thickened resist pattern, and has a surface layer on the initial resist pattern (the resist pattern to be thickened). Thus, the resist pattern of the present invention is suitable for the formation of fine patterns, and an ArF excimer laser can be used as the exposure light when forming the resist pattern.

The surface layer preferably has excellent etching resistance. It is preferable that the etching rate (nm/min) of the surface layer is equivalent to or greater than that of the resist pattern to be thickened which exists at the inner side of the surface layer. Specifically, when measurement is carried out under the same conditions, the ratio (resist pattern to be thickened/surface layer) of the etching rate (nm/min) of the surface layer and the etching rate (nm/min) of the resist pattern to be thickened is preferably 1.1 or more, and is more preferably 1.2 or more, and is particularly preferably 1.3 or more.

The etching rate (nm/min) can be measured by, for example, carrying out etching processing for a predetermined time by using a known etching device, measuring the amount of film reduction of the sample, and determining the amount of film reduction per unit time.

The surface layer can suitably be formed by using the resist pattern thickening material of the present invention. From the standpoint of improving the etching resistance, the surface layer preferably contains at least one of an aromatic compound or a resin containing an aromatic compound in a portion thereof.

Whether the surface layer does or does not contain at least one of an aromatic compound and a resin containing an aromatic compound in a portion thereof, can be confirmed by, for example, analyzing the IR absorption spectrum of the surface layer.

The resist pattern may partially contain at least one of an aromatic compound and a resin containing an aromatic compound in a portion thereof, and such an aspect is preferable from the standpoint of underlying layer workability. In this case, the content of the at least one of the aromatic compound and the resin containing an aromatic compound in a portion thereof can be set so as to gradually decrease from the surface layer toward the inner portion.

In the resist pattern of the present invention, the border between the resist pattern to be thickened and the surface layer may be clear, or may be unclear.

The resist pattern of the present invention can preferably be formed by the process for forming a resist pattern of the present invention which will be described hereinafter.

The resist pattern of the present invention can suitably be used in, for example, the manufacturing of functional parts such as mask patterns, reticle patterns, recording heads, LCDs (liquid crystal displays), PDPs (plasma display panels), SAW filters (surface acoustic wave filters), and the like; optical parts used in connecting optical wiring; fine parts such as microactuators and the like; semiconductor devices; and the like. The resist pattern can be particularly preferably used in the manufacturing of the semiconductor device of the present invention which will be described hereinafter.

(Process for Forming Resist Pattern)

In the process for forming a resist pattern of the present invention, after a resist pattern to be thickened is formed, the resist pattern thickening material of the present invention is applied so as to cover the surface of the resist pattern to be thickened.

Suitable examples of materials of the resist pattern to be thickened are the materials which were listed above in the discussion of the resist pattern thickening material of the present invention.

The resist pattern to be thickened can be formed in accordance with known methods.

The resist pattern to be thickened can be formed on an underlying layer (a base). The underlying layer (base) is not particularly limited, and can be appropriately selected in accordance with the object. However, when the resist pattern to be thickened is formed on a semiconductor device, the underlying layer (base) is a substrate such as a silicon wafer or the like.

The method of applying the resist pattern thickening material is not particularly limited, and can be appropriately selected from among known applying methods in accordance with the object. Suitable examples are a spin coating method and the like. In the case in which a spin coating method is used, the conditions are as follows for example: the rotational speed is about 100 rpm to 10,000 rpm, and is preferably 800 rpm to 5,000 rpm, and the time is about one second to 10 minutes, and is preferably one second to 90 seconds.

The applied thickness at the time of applying is usually about 10 nm (100 Å) to about 1,000 nm (10,000 Å), and is preferably about 100 nm (1,000 Å) to 500 nm (5,000 Å).

It should be noted that, at the time of applying, the surfactant may be applied before applying of the resist pattern thickening material, without being contained in the resist pattern thickening material.

Carrying out prebaking (heating and drying) of the applied resist pattern thickening material during applying or after applying is preferable from the standpoint that the resist pattern thickening material can be efficiently mixed (impregnated) into the resist pattern to be thickened at the interface between the resist pattern to be thickened and the resist pattern thickening material.

The conditions, the method and the like of the prebaking (heating and drying) are not particularly limited and can be appropriately selected in accordance with the object, provided that they do not cause softening of the resist pattern to be thickened. For example, the temperature is about 40° C. to about 120° C., and is preferably 70° C. to 100° C., and the time is about 10 seconds to about 5 minutes, and is preferably 40 seconds to 100 seconds.

Carrying out crosslinking baking (a crosslinking reaction) of the applied resist pattern thickening material after the prebaking (heating and drying) is preferable from the standpoint that the crosslinking reaction of the mixed (impregnated) portion at the interface between the resist pattern to be thickened and the resist pattern thickening material can be made to proceed efficiently.

The conditions, the method and the like of the crosslinking baking (the crosslinking reaction) are not particularly limited and can be appropriately selected in accordance with the object. However, usually, a temperature higher than that during the prebaking (heating and drying) is used. The conditions of the crosslinking baking (the crosslinking reaction) are, for example, the temperature is about 70° C. to about 150° C., and is preferably 90° C. to 130° C., and the time is about 10 seconds to about 5 minutes, and is preferably 40 seconds to 100 seconds.

Carrying out developing processing of the applied resist pattern thickening material after the crosslinking baking (the crosslinking reaction) is preferable from the standpoint that, among the applied resist pattern thickening material, the portions thereof which have not crosslinked with the resist pattern to be thickened and the portions thereof at which the crosslinking is weak (the portions having high water solubility) are dissolved and removed, so that the resist pattern of the present invention, which is formed in a thickened state, can be developed.

The same comments as those above regarding developing processing are applicable here as well.

The process for forming the resist pattern of the present invention will be described hereinafter with reference to the drawings.

Figure 2A:
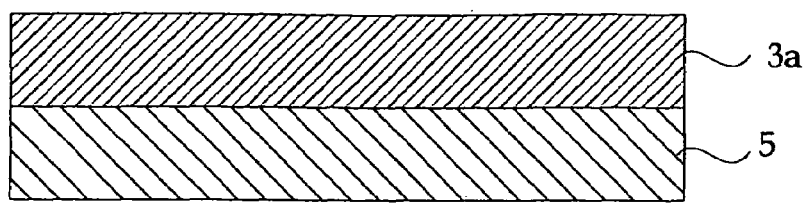
FIGS. 2A to 2E are schematic diagrams for explaining one example of a process for forming a resist pattern of the present invention.
Figure 2B:
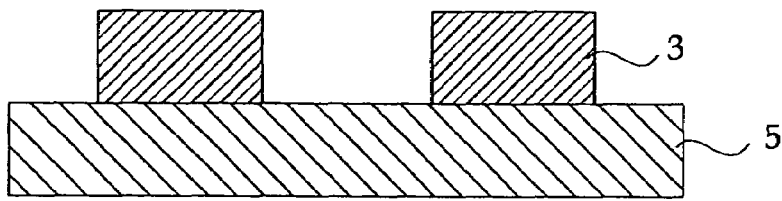
Figure 2C:
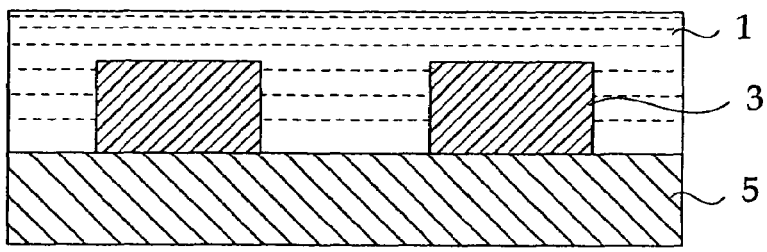

As shown in FIG. 2A, after a resist material (a material for a resist pattern to be thickened) 3a is applied onto the underlying layer (base) 5, as shown in FIG. 2B, the resist material (the material for a resist pattern to be thickened) 3a is patterned so that a resist pattern (a resist pattern to be thickened) 3 is formed. Thereafter, as shown in FIG. 2C, the resist pattern thickening material 1 is applied onto the surface of the resist pattern (the resist pattern to be thickened) 3, and prebaking (heating and drying) is carried out so that a film is formed. Then, mixing (impregnating) of the resist pattern thickening material 1 into the resist pattern (the resist pattern to be thickened) 3 takes place at the interface between the resist pattern (the resist pattern to be thickened) 3 and the resist pattern thickening material 1.

Figure 2D:
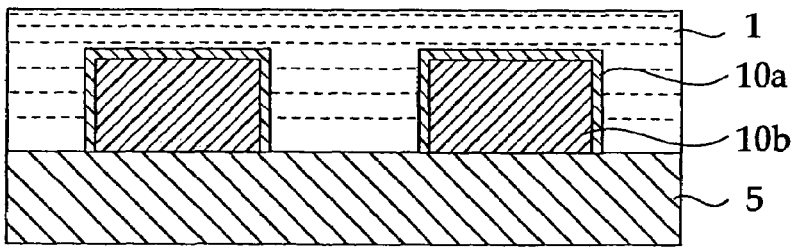
Figure 2E:
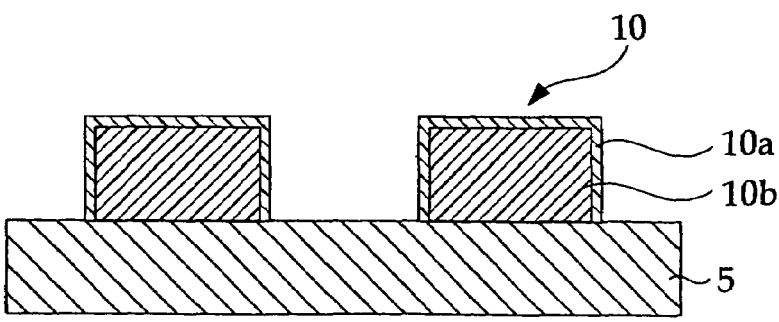

Here, as shown in FIG. 2D, when crosslinking baking (a crosslinking reaction) is carried out at a temperature which is higher than that of the prebaking (heating and drying), the mixed (impregnated) portion at the interface of the resist pattern (to be thickened) 3 and the resist pattern thickening material 1 crosslinks. Thereafter, as shown in FIG. 2E, by carrying out developing processing, among the applied resist pattern thickening material 1, the portions thereof which have not crosslinked with the resist pattern (the resist pattern to be thickened) 3 and the portions thereof at which the crosslinking is weak (the portions having high water solubility) are dissolved and removed, so that a resist pattern 10 having the surface layer 10a on the resist pattern 10b (the resist pattern 3) is formed (developed).

The developing processing may be carried out in water or a weak alkali aqueous solution. However, water developing is preferable from the standpoint that the developing processing can be carried out efficiently at a low cost.

The resist pattern 10 has, on a surface of the resist pattern 10b (the resist pattern 3), the surface layer 10a which has been formed by the resist pattern thickening material 1 crosslinking on the resist pattern (the resist pattern to be thickened) 3. The resist pattern 10 is made thicker than the resist pattern (the resist pattern to be thickened) 3 by an amount corresponding to the thickness of the surface layer 10a. Thus, the width of a space pattern formed by the resist pattern 10 is smaller than that of the former space pattern (the resist pattern to be thickened) 3, and the space pattern formed by the resist pattern 10 is particularly fine.

The surface layer 10a of the resist pattern 10 is formed by the resist pattern thickening material 1. In a case in which the resist pattern thickening material 1 contains at least one of an aromatic compound and a resin containing an aromatic compound in a portion thereof, even if the resist pattern (the resist pattern to be thickened) 3 is a material which has poor etching resistance, the resist pattern 10, which has on the surface thereof the surface layer 10a having excellent etching resistance, is a structure whose etching resistance is markedly excellent.

The resist pattern which is formed by the process for forming a resist pattern of the present invention is the resist pattern of the present invention. The resist pattern has, on the surface of the resist pattern to be thickened, a surface layer which is formed by the resist pattern thickening material of the present invention crosslinking on the resist pattern to be thickened. When the resist pattern thickening material contains at least one of an aromatic compound and a resin containing an aromatic compound in a portion thereof, even if the resist pattern to be thickened is a material having poor etching resistance, the resist pattern, which has the surface layer having excellent etching resistance on the surface of the resist pattern to be thickened, can efficiently be formed. Further, the resist pattern which is formed by the process for forming a resist pattern of the present invention is made thicker than the resist pattern to be thickened by an amount corresponding to the thickness of the surface layer. Therefore, the diameter or the width of a space pattern formed by the resist pattern is smaller than those of the former space pattern formed by the resist pattern to be thickened. Therefore, in accordance with the process for forming a resist pattern of the present invention, a fine space pattern can be formed efficiently.

The resist pattern formed by the process for forming a resist pattern of the present invention can suitably be used in, for example, the manufacturing of functional parts such as mask patterns, reticle patterns, recording heads, LCDs (liquid crystal displays), PDPs (plasma display panels), SAW filters (surface acoustic wave filters), and the like; optical parts used in connecting optical wiring; fine parts such as microactuators and the like; semiconductor devices; and the like. The resist pattern can be particularly preferably used in the manufacturing of the semiconductor device of the present invention which will be described hereinafter.

(Semiconductor Device and Process for Manufacturing Semiconductor Device)

The semiconductor device of the present invention is not particularly limited, provided that it is manufactured by using the resist pattern thickening material of the present invention, and that it has a fine pattern (a wiring pattern or the like) formed by the resist pattern of the present invention. The semiconductor device has known members and the like which are appropriately selected as needed.

Specific examples of the semiconductor device of the present invention are flash memories, DRAMs, FRAMs, and the like.

The semiconductor device of the present invention can suitably be manufactured by the process for manufacturing a semiconductor device of the present invention.

The process for manufacturing a semiconductor device of the present invention has a resist pattern forming step, and a patterning step. The process may include other steps which are appropriately selected as needed.

The resist pattern forming step is a step of, after forming a resist pattern to be thickened on an underlying layer, applying the resist pattern thickening material of the present invention so as to cover the surface of the resist pattern to be thickened, so as to thicken the resist pattern (to be thickened) and form a resist pattern.

Examples of the underlying layer are surface layers of various members in semiconductor devices. Suitable examples thereof are substrates such as silicon wafers, various types of oxide films, and the like. The method of applying the resist pattern thickening material is as described above. Further, after the applying, it is preferable to carry out the above-described prebaking, crosslinking baking, and the like.

The patterning step is a step of patterning the underlying layer (e.g., a wiring layer) by carrying out etching (dry etching or the like) by using, as a mask, the resist pattern formed by the resist pattern forming step.

The method of etching is not particularly limited, and can be appropriately selected from among known methods in accordance with the object. Dry etching is a suitable example. The etching conditions are not particularly limited, and can be appropriately selected in accordance with the object.

Suitable examples of other steps are a surfactant applying step, a developing processing step, and the like.

The surfactant applying step is a step of applying a surfactant on the surface of the resist pattern to be thickened, before the resist pattern forming step.

The surfactant is not particularly limited, and can be appropriately selected in accordance with the object. Suitable examples thereof are the same as the surfactants listed above, such as polyoxyethylene-polyoxypropylene condensation products, polyoxyalkylene alkylether compounds, polyoxyethylene alkylether compounds, polyoxyethylene derivatives, sorbitan fatty acid ester compounds, glycerin fatty acid ester compounds, primary alcohol ethoxylate compounds, phenol ethoxylate compounds, and nonylphenol ethoxylate surfactants, octylphenol ethoxylate surfactants, lauryl alcohol ethoxylate surfactants, oleyl alcohol ethoxylate surfactants, fatty acid ester surfactants, amide surfactants, natural alcohol surfactants, ethylene diamine surfactants, and secondary alcohol ethoxylate surfactants, alkyl cationic surfactants, amide type quaternary cationic surfactants, ester type quaternary cationic surfactants, amine oxide surfactants, and betaine surfactants, and the like.

The developing processing step is a step of carrying out developing after the resist pattern forming step and before the patterning step. It should be noted that the developing is as described previously.

In accordance with the process for manufacturing a semiconductor device of the present invention, it is possible to efficiently manufacture various types of semiconductor devices such as flash memories, DRAMs, FRAMs, and the like.

Hereinafter, Examples of the present invention will be concretely described. However, the present invention is not in any way limited to these Examples.

EXAMPLE 1

—Preparation of Resist Pattern Thickening Material—

Resist pattern thickening materials A through O of the present invention having the compositions shown in Table 1 were prepared. Note that, in Table 1, the unit of the values in parentheses is parts by mass. In the "resin" column, "KW-3" is a polyvinyl acetal resin (manufactured by Sekisui Chemical Co., Ltd.). In the "crosslinking agent" column, "uril" is tetramethoxymethylglycol uril, and "urea" is N,N'-dimethoxymethyldimethoxyethylene urea. In the "surfactant" column, "SO-135" is a non-ionic surfactant (a secondary alcohol ethoxylate surfactant manufactured by Asahi Denka Co., Ltd.), "NP-675" is a non-ionic surfactant (a nonylphenol ethoxylate surfactant manufactured by Asahi Denka Co., Ltd.), "SP-12" is a non-ionic surfactant (a special phenol ethoxylate surfactant manufactured by Asahi Denka Co., Ltd.), "T-81" is a non-ionic surfactant (a sorbitan ester surfactant manufactured by Asahi Denka Co., Ltd.), "LB-53B" is a non-ionic surfactant (a natural alcohol surfactant manufactured by Asahi Denka Co., Ltd.), "LO-7" is a non-ionic surfactant (a primary alcohol ethoxylate surfactant manufactured by Asahi Denka Co., Ltd.), "TR-704" is a non-ionic surfactant (an ethylene diamine surfactant manufactured by Asahi Denka Co., Ltd.), "LA-775" is a non-ionic surfactant (a natural alcohol surfactant manufactured by Asahi Denka Co., Ltd.), "YA-6" is a cationic surfactant (an amide type quaternary cationic surfactant manufactured by Asahi Denka Co., Ltd.), "SF-107" is a cationic surfactant (an ester cationic surfactant manufactured by Asahi Denka Co., Ltd.), "LDM" is an amphoteric surfactant (an amine oxide surfactant manufactured by Asahi Denka Co., Ltd.), "AB-35L" is an amphoteric surfactant (a betaine surfactant manufactured by Asahi Denka Co., Ltd.), and "B-733" is a non-ionic surfactant (a higher alcohol surfactant manufactured by Asahi Denka Co., Ltd.). Further, a mixed liquid of pure water (deionized water) and isopropyl alcohol (whose mass ratio was pure water (deionized water):isopropyl alcohol=98.6: 0.4) was used as the other main solvent component other than the resin and the crosslinking agent.

TABLE 1

| thickening material | resin | crosslinking agent | water-soluble aromatic compound | surfactant |
|---|---|---|---|---|
| A | KW-3 (16) | uril (1.2) | none | SO-135 (0.25) secondary alcohol ethoxylate |
| B | KW-3 (20) | urea (1.5) | none | NP-675 (0.25) nonylphenol ethoxylate |
| C | KW-3 (10) | melamine (0.5) | none | SP-12 (0.25) special phenol ethoxylate |
| D | KW-3 (16) | uril (1.2) | none | T-81 (0.25) sorbitan ester |
| E | KW-3 (16) | uril (1.2) | none | LB-53B (0.25) natural alcohol |
| F | KW-3 (16) | uril (1.2) | none | LO-7 (0.25) primary alcohol ethoxylate |
| G | KW-3 (16) | uril (1.2) | none | TR-704 (0.25) ethylene diamine |
| H | KW-3 (16) | uril (1.2) | none | LA-775 (0.25) natural alcohol |
| I | KW-3 (16) | urea (1.0) | none | YA-6 (0.25) amide |
| J | KW-3 (16) | uril (1.2) | none | SF-107 (0.25) ester cationic |
| K | KW-3 (16) | uril (1.2) | none | LDM (0.25) amine oxide |
| L | KW-3 (16) | uril (1.2) | none | AB-35L (0.25) betaine |
| M | KW-3 (16) | uril (1.2) | none | B-733 (0.25) higher alcohol |

TABLE 1-continued

| thickening material | resin | crosslinking agent | water-soluble aromatic compound | surfactant |
|---|---|---|---|---|
| N | KW-3 (16) | uril (1.2) | resorcinol (3) | SO-135 (0.25) |
| O | KW-3 (16) | uril (1.2) | catechin (5) | LB-53B (0.25) |

—Resist Pattern and Forming Method Thereof—

The resist pattern thickening materials A through O of the present invention which were prepared as described above were applied onto trench patterns (width: 150 nm) formed by ArF resists (PAR700, manufactured by Sumitomo Chemical Co., Ltd.), by a spin coating method, first under the condition of 1,000 rpm/5 s, and then under the condition of 3,500 rpm/40 s. Thereafter, prebaking was carried out under the condition of 85° C./70 s, and then crosslinking baking was carried out under the condition of 90° C./70 s to 110° C./70 s. Thereafter, developing was carried out on the resist patterns which had been thickened by the resist pattern thickening materials A through O, by rinsing the resist pattern thickening materials A through O for 60 seconds with pure water, so that the uncrosslinked portions were removed. Thus, resist patterns were prepared.

The sizes of the space patterns formed by the prepared resist patterns are shown in Table 2 together with the degrees of reduction from the sizes of the space patterns formed by the initial resist patterns (the resist patterns to be thickened). Note that, in Table 2, "A" through "O" correspond to the resist pattern thickening materials A through O.

TABLE 2

| thickening material | width after thickening process (nm) | size reduction (nm) |
|---|---|---|
| A | 105.3 | 45.0 |
| B | 122.0 | 29.3 |
| C | 111.5 | 30.1 |
| D | 135.9 | 18.0 |
| E | 114.5 | 32.6 |
| F | 130.8 | 22.1 |
| G | 129.5 | 21.6 |
| H | 133.8 | 20.3 |
| I | 129.2 | 23.3 |
| J | 138.0 | 17.5 |
| K | 141.2 | 13.2 |
| L | 143.6 | 10.2 |
| M | 114.3 | 38.8 |
| N | 103.8 | 43.9 |
| O | 118.2 | 30.8 |

The resist pattern thickening materials A through O of the present invention which were prepared as described above were applied onto hole patterns (hole diameter: 150 nm) formed by ArF resists (PAR700, manufactured by Sumitomo Chemical Co., Ltd.), by a spin coating method, first under the condition of 1,000 rpm/5 s, and then under the condition of 3,500 rpm/40 s. Thereafter, prebaking was carried out under the condition of 85° C./70 s, and then crosslinking baking was carried out under the condition of 90° C./70 s to 110° C./70 s. Thereafter, developing was carried out on the resist patterns which had been thickened by the resist pattern thickening materials A through O, by rinsing the resist pattern thickening materials A through O for 60 seconds with pure water, so that the uncrosslinked portions were removed. Thus, resist patterns were prepared.

The sizes of the space patterns formed by the prepared resist patterns are shown in Table 3 together with the degrees of reduction from the sizes of the space patterns formed by the initial resist patterns (the resist patterns to be thickened). Note that, in Table 3, "A" through "O" correspond to the resist pattern thickening materials A through O.

TABLE 3

| thickening material | diameter after thickening process (nm) | size reduction (nm) |
|---|---|---|
| A | 108.8 | 42.0 |
| B | 127.0 | 25.1 |
| C | 111.1 | 33.1 |
| D | 130.2 | 14.3 |
| E | 122.0 | 34.5 |
| F | 133.8 | 19.9 |
| G | 135.2 | 18.6 |
| H | 135.1 | 15.9 |
| I | 120.2 | 25.7 |
| J | 134.5 | 16.5 |
| K | 140.0 | 10.1 |
| L | 143.7 | 10.5 |
| M | 112.2 | 36.8 |
| N | 109.5 | 40.5 |
| O | 121.2 | 29.8 |

From the results of Table 2 and Table 3, it can be understood that the resist pattern thickening materials of the present invention can be applied to both a line pattern (a line-and-space pattern) and a hole pattern, and can thicken resist materials in both cases. When the resist pattern thickening materials of the present invention are used in forming a hole pattern, the inner diameter of the hole pattern can be made to be narrow and fine. Further, when the resist pattern thickening materials of the present invention are used in forming a line pattern (a line-and-space pattern), the space widths (the intervals between the resist patterns forming linear patterns) of the line pattern (the line-and-space pattern) can be made to be small and fine. Moreover, when the resist pattern thickening materials of the present invention are used in forming an isolated pattern, the surface area of the isolated pattern can be increased.

Next, the resist pattern thickening materials N and O were applied and crosslinked on the surfaces of resist patterns to be thickened formed on silicon substrates, and surface layers having a thickness of 0.5 μm were formed. Etching was carried out for three minutes under the conditions of Pμ=200 W, pressure=0.02 Torr, $CF_4$ gas=100 sccm by using an etching device (a parallel plate type RIE device manufactured by Fujitsu Ltd.), on the surface layers, and on a KrF resist (UV-6 manufactured by Shipley Company, L.L.C.) for comparison, and on polymethyl methacrylate (PMMA) for comparison. The amounts of film reduction of the samples were measured, the etching rates were calculated, and relative evaluation was carried out by using the etching rate of the KrF resist as the standard.

TABLE 4

| thickening material | etching rate (nm/min) | ratio of etching rates |
|---|---|---|
| UV-6 | 62.7 (627 Å/min) | 1.00 |
| PMMA | 77.0 (770 Å/min) | 1.23 |
| N | 66.5 (665 Å/min) | 1.06 |
| O | 66.2 (662 Å/min) | 1.06 |

From the results shown in Table 4, it can be understood that the etching resistances of the resist pattern thickening materials of the present invention were near to that of the KrF resist and were markedly superior as compared with PMMA.

Next, trench patterns of a width of 150 nm were formed as resist patterns to be thickened formed on silicon substrates, by using a 50 keV electron beam exposure device and using PMMA (polymethyl methacrylate). The resist pattern thickening materials A, E, M of the present invention were applied and crosslinked on the resist patterns to be thickened, and the thickening effects thereof were observed in the same way as described above.

TABLE 5

| thickening material | width after thickening process (nm) | size reduction (nm) |
|---|---|---|
| A | 75.3 | 79.2 |
| E | 94.0 | 55.8 |
| M | 88.1 | 65.8 |

Next, the resist pattern thickening materials A through O of the present invention were applied onto resist patterns to be thickened on wafer substrates which had been left outside of a clean room for one year after exposure. Pattern thickening effects, which were similar to those in the case in which the resist pattern thickening materials were applied immediately after exposure, were obtained.

From these results, it can be surmised that the resist pattern thickening materials of the present invention did not thicken the resist patterns to be thickened by using a crosslinking reaction caused by acid diffusion as is the case with the conventional technique called RELACS, but rather, thickened the resist patterns to be thickened depending on their compatibility with the resist patterns to be thickened.

As described above, the resist pattern thickening materials of the present invention can be applied both to cases in which the resist pattern (the resist pattern to be thickened) which is the object of applying is a chemically amplified resist, and cases in which the resist pattern (the resist pattern to be thickened) which is the object of applying is a non-chemically amplified resist.

EXAMPLE 2

—Flash Memory and Process for Manufacturing the Same—

Example 2 is an example of the semiconductor device and a process for manufacturing the same of the present invention using the resist pattern thickening material of the present invention. Note that, in Example 2, resist films (resist patterns) 26, 27, 29, 32, and 34 which will be described hereinafter are resist films which have been thickened by the same method as in Examples 1 by using the resist pattern thickening material of the present invention.

Figure 3A:
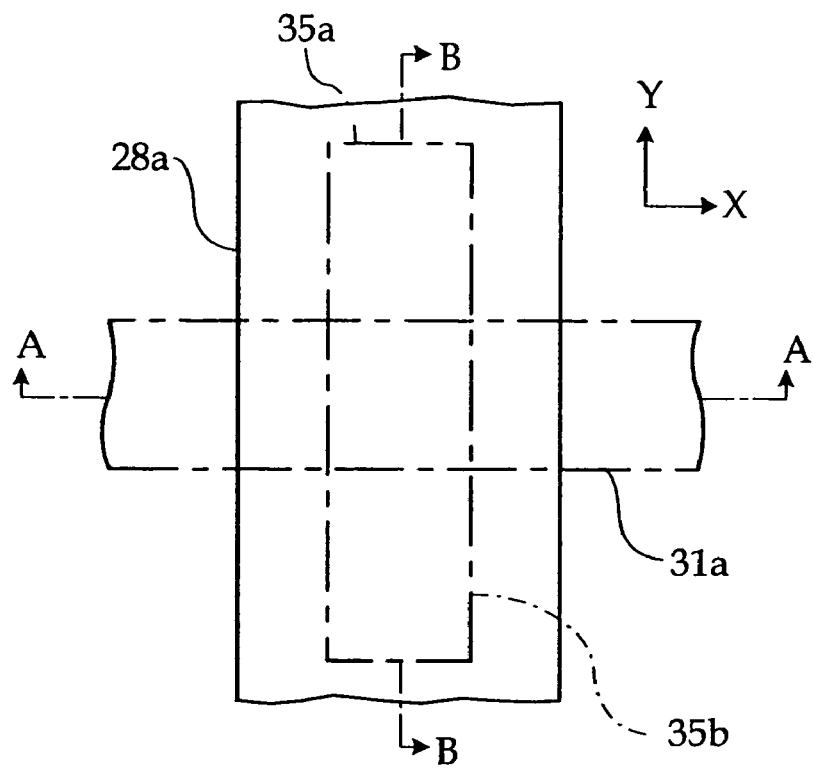
FIGS. 3A to 3B are top views for explaining a FLASH EPROM which is one example of a semiconductor device of the present invention.
Figure 3B:
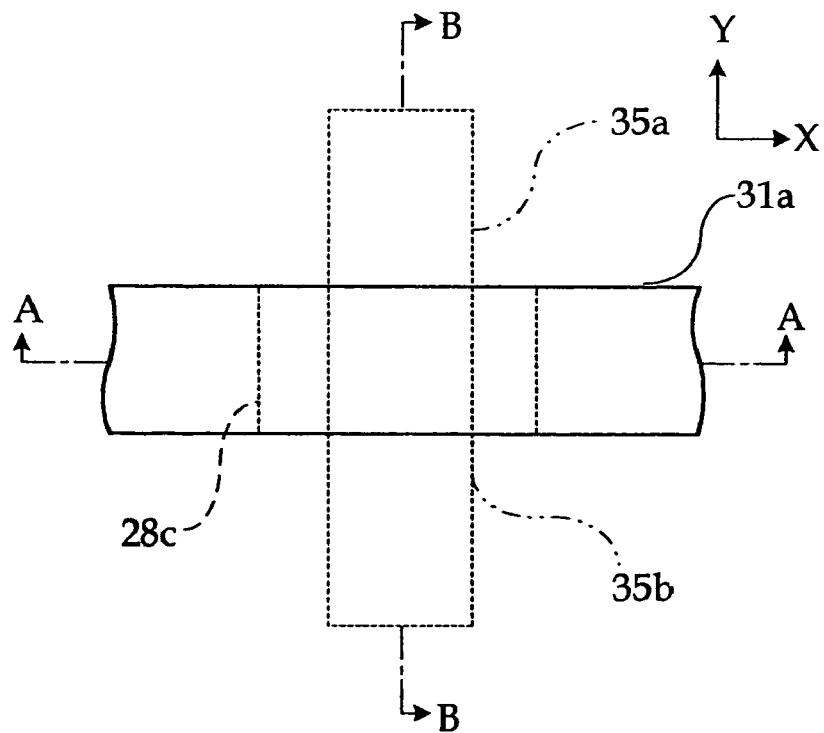

FIGS. 3A and 3B are top views (plan views) of a FLASH EPROM which is called a FLOTOX type or an ETOX type. Note that FIGS. 4A through 4C, FIGS. 5 D through 5F, and FIGS. 6G through 6I are cross-sectional schematic views for explaining an example of a process for manufacturing the FLASH EPROM. In FIGS. 4A through 6I, the illustrations at the left sides are the memory cell portion (a first element region), and are schematic diagrams of the cross-section (the A direction cross-section) of the gate widthwise direction (the X direction in FIGS. 3A and 3B) of the portion at which a MOS transistor having a floating gate electrode is formed. The illustrations at the center are the memory cell portion, which is the same portion as in the left side drawings, and are schematic diagrams of the cross-section (the B direction cross-section) of the gate lengthwise direction (the Y direction in FIGS. 3A and 3B) which is orthogonal to the X direction. The illustrations at the right side are schematic diagrams of the cross-section (the A direction cross-section in FIGS. 3A and 3B) of the portion of the peripheral circuit portion (a second element region) at which a MOS transistor is formed.

Figure 4A:
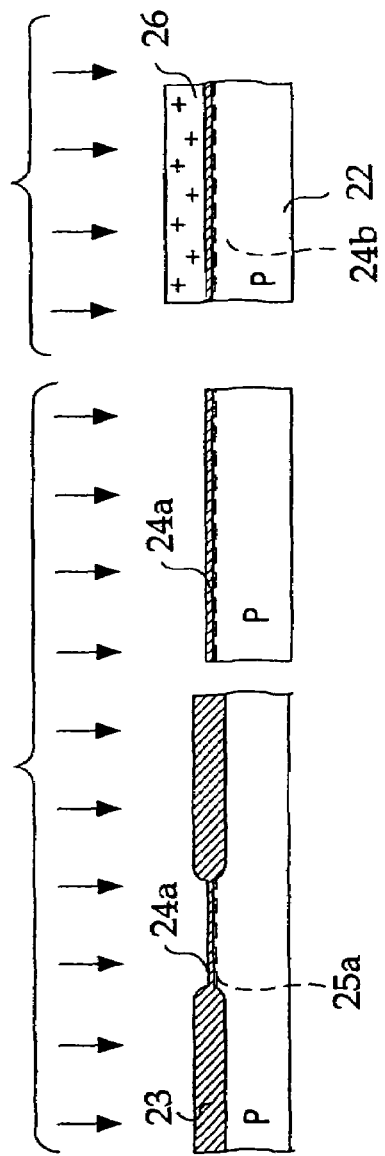
FIGS. 4A to 4C are part 1 of a set of cross-sectional schematic diagrams for explaining a process for manufacturing the FLASH EPROM which is one example of a process for manufacturing a semiconductor device of the present invention.
Figure 4B:
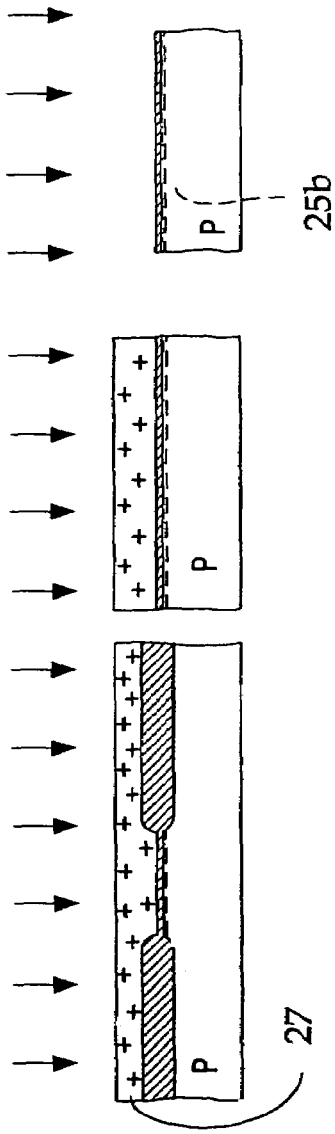

First, as shown in FIG. 4A, a field oxide film 23 of $SiO_2$ was selectively formed at the element isolation region on a p-type Si substrate 22. Thereafter, a first gate insulating film 24a was formed at the MOS transistor of the memory cell portion (the first element region), by an $SiO_2$ film by thermal oxidation so as to become a thickness of 10 nm (100 Å) to 30 nm (300 Å). In a separate process, a second gate insulating film 24b was formed at the MOS transistor of the peripheral circuit portion (the second element region), by an $SiO_2$ film by thermal oxidation so as to become a thickness of 10 nm (100 Å) to 50 nm (500 Å). Note that, when the first gate insulating film 24a and the second gate insulating film 24b are the same thickness, these oxide films may be formed simultaneously in the same process.

Next, in order to form a MOS transistor having depression type n-channels at the memory cell portion (the left side and the center in FIG. 4A), the peripheral circuit portion (the right side in FIG. 4A) was masked by the resist film 26 for the purpose of controlling the threshold voltage. Then, phosphorus (P) or arsenic (As) was introduced, as an n-type impurity in a dosage amount of $1\times10^{11}$ $cm^{-2}$ to $1\times10^{14}$ $cm^{-2}$ by an ion implantation method, into the regions which were to become the channel regions directly beneath the floating gate electrodes, so that a first threshold value control layer 25a was formed. Note that the dosage amount and the conductive type of the impurity at this time can be appropriately selected in accordance with whether depression type channels or accumulation type channels are to be formed.

Next, in order to form a MOS transistor having depression type n-channels at the peripheral circuit portion (the right side in FIG. 4B), the memory cell portion (the left side and the center in FIG. 4B) was masked by the resist film 27 for the purpose of controlling the threshold voltage. Then, phosphorus (P) or arsenic (As) was introduced, as an n-type impurity in a dosage amount of $1\times10^{11}$ to $1\times10^{14}$ $cm^{-2}$ by an ion implantation method, into the regions which were to become the channel regions directly beneath the gate electrodes, so that a second threshold value control layer 25b was formed.

Figure 4C:
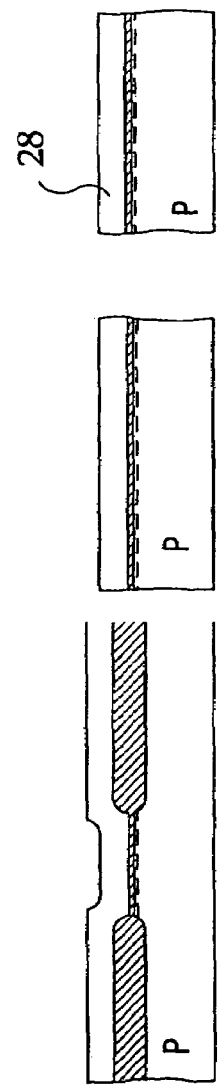

Next, a first polysilicon film (a first conductor film) 28 having a thickness of 50 nm (500 Å) to 200 nm (2000 Å) was applied to the entire surface as a floating gate electrode of the MOS transistor at the memory cell portion (the left side and the center in FIG. 4C) and as a gate electrode of the MOS transistor at the peripheral circuit portion (the right side in FIG. 4C).

Figure 5D:
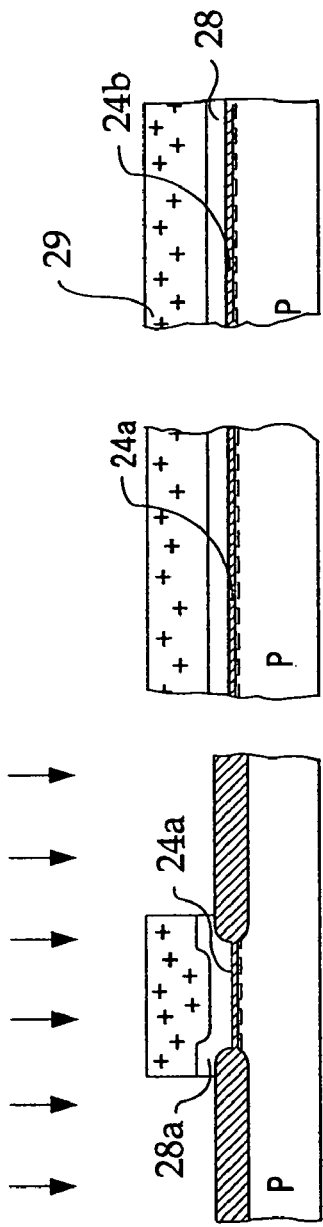
FIGS. 5D to 5F are part 2 of the set of cross-sectional schematic diagrams for explaining the process for manufacturing the FLASH EPROM which is one example of the process for manufacturing a semiconductor device of the present invention.
Figure 6G:
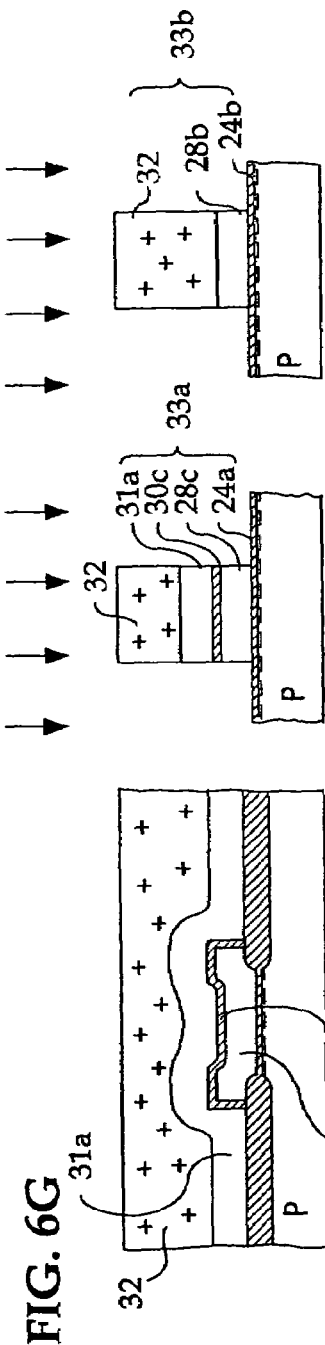
FIGS. 6G to 6I are part 3 of the set of cross-sectional schematic diagrams for explaining the process for manufacturing the FLASH EPROM which is one example of the process for manufacturing a semiconductor device of the present invention.
Figure 6H:
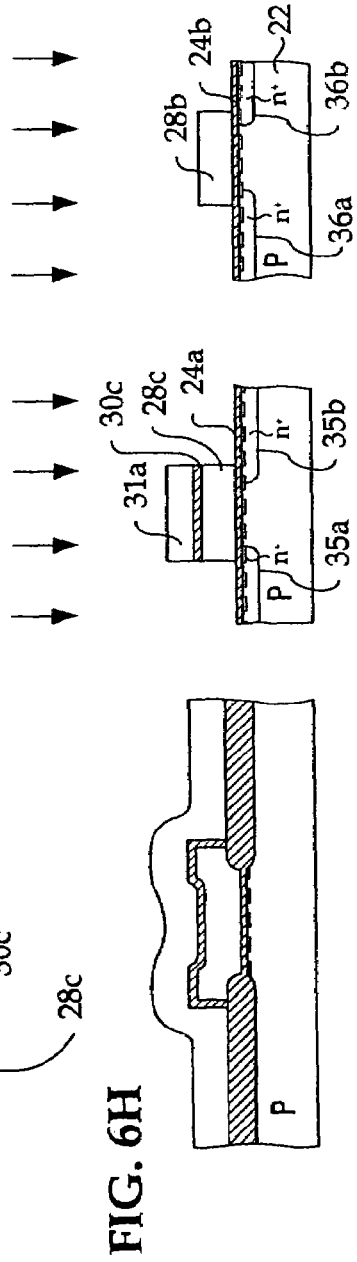
Figure 6I:
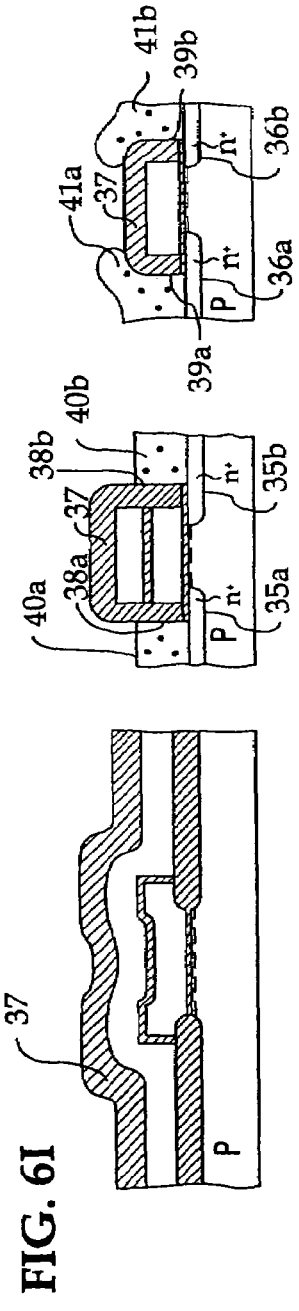

Thereafter, as shown in FIG. 5D, the first polysilicon film 28 was patterned by using the resist film 29 formed as a mask, so that a floating gate electrode 28a was formed at the MOS transistor at the memory cell portion (the left side and the center in FIG. 5D). At this time, as shown in FIG. 5D, in the X direction, patterning was carried out so as to obtain the final width, and in the Y direction, the region which was to become the S/D region layer remained covered by the resist film 29 without patterning.

Figure 5E:
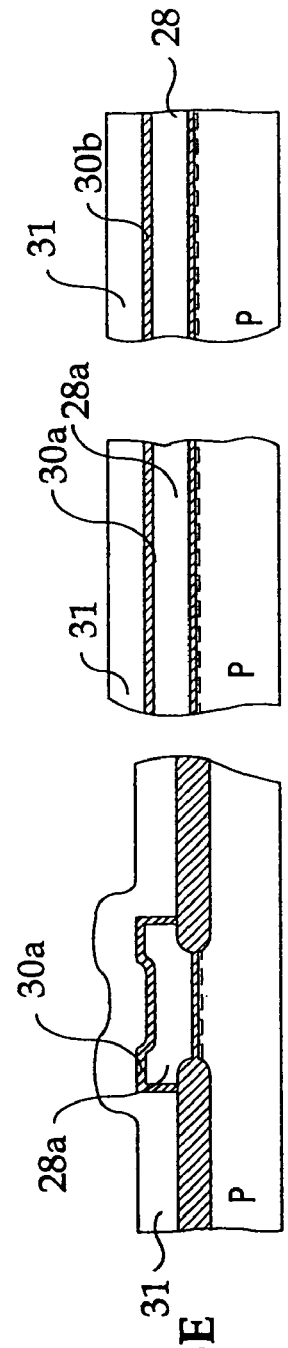

Next, as shown in the left side and the center of FIG. 5E, after the resist film 29 was removed, a capacitor insulating film 30a formed of an $SiO_2$ film was formed by thermal oxidation to a thickness of approximately of 20 nm (200 Å) to 50 nm (500 Å) so as to cover the floating gate electrode 28a. At this time, a capacitor insulating film 30b formed of an $SiO_2$ film was formed on the first polysilicon film 28 of the peripheral circuit portion (the right side in FIG. 5E). Here, although the capacitor insulating films 30a and 30b were formed only by $SiO_2$ films, they may be formed by a composite film of two to three layers of $SiO_2$ and $Si_3N_4$ films.

Next, as shown in FIG. 5E, a second polysilicon film (a second conductor film) 31, which was to become a control gate electrode, was formed to a thickness of 50 nm (500 Å) to 200 nm (2000 Å) so as to cover the floating gate electrode 28a and the capacitor insulating film 30a.

Figure 5F:
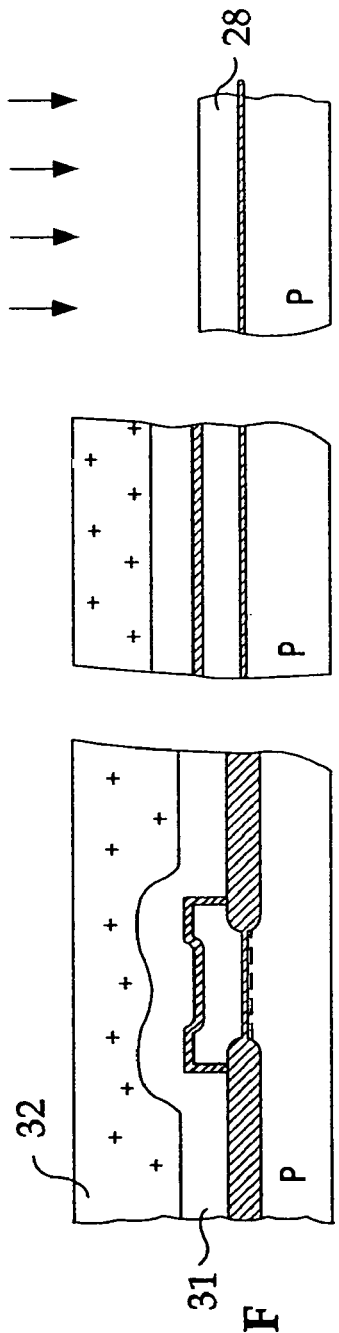

Then, as shown in FIG. 5F, the memory portion (the left side and the center of FIG. 5F) was masked by the resist film 32, and the second polysilicon film 31 and the capacitor insulating film 30b of the peripheral circuit portion (the right side in FIG. 5F) were successively removed by etching so that the first polysilicon film 28 was exposed at the surface.

Subsequently, as shown in FIG. 6G, the second polysilicon film 31, the capacitor insulating film 30a and the first polysilicon film 28a which had been patterned only in the X direction, of the memory portion (the left side and the center of FIG. 6G), were, by using the resist film 32 as a mask, subjected to patterning in the Y direction so as to become the final dimension of a first gate portion 33a. A laminate structure formed by a control gate electrode 31a/a capacitor insulating film 30c/a floating gate electrode 28c, which had a width of approximately 1 μm in the Y direction, was formed. The first polysilicon film 28 of the peripheral circuit portion (the left side in FIG. 6G) was, by using the resist film 32 as a mask, subjected to patterning so as to become the final dimension of a second gate portion 33b, and a gate electrode 28b of a width of approximately 1 μm was formed.

Next, by using the laminate structure formed by the control gate electrode 31a/the capacitor insulating film 30c/the floating gate electrode 28c of the memory cell portion (the left side and the center of FIG. 6H) as a mask, phosphorus (P) or arsenic (As) was introduced, in a dosage amount of $1\times10^{14}$ $cm^{-2}$ to $1\times10^{16}$ $cm^{-2}$ by an ion implantation method, into the Si substrate 22 of the element forming region, so that n-type S/D region layers 35a and 35b were formed. By using the gate electrode 28b at the peripheral circuit portion (the right side of FIG. 6H) as a mask, phosphorus (P) or arsenic (As) was introduced, as an n type impurity in a dosage amount of $1\times10^{14}$ $cm^{-2}$ to $1\times10^{16}$ $cm^{-2}$ by an ion implantation method, into the Si substrate 22 of the element forming region, so that S/D region layers 36a and 36b were formed.

Subsequently, the first gate portion 33a of the memory cell portion (the left side and the center of FIG. 6I) and the second gate portion 33b of the peripheral circuit portion (the right side of FIG. 6I) were covered by forming an interlayer insulating film 37 formed of a PSG film to a thickness of about 500 nm (5000 Å).

Thereafter, contact holes 38a, 38b and contact holes 39a, 39b were formed in the interlayer insulating film 37 formed on the S/D region layers 35a, 35b and the S/D region layers 36a, 36b. Thereafter, S/D electrodes 40a, 40b and S/D electrodes 41a, 41b were formed.

In this way, as shown in FIG. 6I, the FLASH EPROM was manufactured as a semiconductor device.

In this FLASH EPROM, the second gate insulating film 24b of the peripheral circuit portion (the right side in FIGS. 4A through 6I) is covered (refer to the right side in FIGS. 4C through 6I) by the first polysilicon film 28 or the gate electrode 28b always after formation. Thus, the second gate insulating film 24b is maintained at the thickness at which it was initially formed. Thus, it is easy to control the thickness of the second gate insulating film 24b, and easy to adjust the concentration of the conductive impurity in order to control the threshold voltage.

Note that, in the above-described example, in order to form the first gate portion 33a, first, patterning is carried out at a predetermined width in the gate widthwise direction (the X direction in FIGS. 3A and 3B), and thereafter, patterning is carried out in the gate lengthwise direction (the Y direction in FIGS. 3A and 3B) so as to attain the final predetermined width. However, conversely, patterning may be carried out at a predetermined width in the gate lengthwise direction (the Y direction in FIGS. 3A and 3B), and thereafter, patterning may be carried out in the gate widthwise direction (the X direction in FIGS. 3A and 3B) so as to attain the final predetermined width.

The example of manufacturing a FLASH EPROM shown in FIGS. 7A through 7C is the same as the above-described example, except that the processes after the process shown by FIG. 5F in the above example are changed to the processes shown in FIGS. 7A through 7C. Namely, as shown in FIG. 7A, this example differs from the above-described example only with respect to the point that a polycide film is provided by forming a high melting point metal film (a fourth conductor film) 42 formed of a tungsten (W) film or a titanium (Ti) film to a thickness of approximately 200 nm (2000 Å), on the second polysilicon film 31 of the memory cell portion shown at the left side and the center of FIG. 7A and on the first polysilicon film 28 of the peripheral circuit portion shown at the right side in FIG. 7A. The processes after FIG. 7A, i.e., the processes shown in FIGS. 7B and 7C, are the same as those shown in FIGS. 6G through 6I. Explanation of the processes which are the same as those shown in FIGS. 6G through 6I is omitted. In FIGS. 7A through 7C, portions which are the same as those in FIGS. 6G through 6I are denoted by the same reference numerals.

In this way, as shown in FIG. 7C, the FLASH EPROM was manufactured as a semiconductor device.

In this FLASH EPROM, high melting point metal films (the fourth conductor films) 42a and 42b were formed on the control gate electrode 31a and the gate electrode 28b. Thus, the electrical resistance value could be decreased even more.

Note that, here, the high melting point metal films (the fourth conductor films) 42a and 42b were used as the high melting point metal film (the fourth conductor film). However, a high melting point metal silicide film such as a titanium silicide (TiSi) film or the like may be used.

The example of manufacturing a FLASH EPROM shown in FIGS. 8A through 8C is the same as the above-described example, except that a second gate portion 33c of the peripheral circuit portion (the second element region) (the right side in FIG. 8A) also has the structure of the first polysilicon film 28b (first conductor film)/an $SiO_2$ film 30d (capacitor insulating film)/a second polysilicon film 31b (second conductor film) in the same way as the first gate portion 33a of the memory cell portion (the first element region) (the left side and center in FIG. 8A), and that the first polysilicon film 28b and the second polysilicon film 31b are short-circuited so as to form a gate electrode as shown in FIG. 8B or FIG. 8C.

Here, as shown in FIG. 8B, an opening 52a, which passes through the first polysilicon film 28b (first conductor film)/the SiO₂ film 30d (capacitor insulating film)/the second polysilicon film 31b (second conductor film), is formed at a different place than, for example, a second gate portion 33c shown in FIG. 8A, e.g., on an insulating film 54. A third conductive film, for example, a high melting point metal film 53a such as a W film or a Ti film or the like, is filled in the opening 52a. The first polysilicon film 28b and the second polysilicon film 31b are thereby short-circuited. Or, as shown in FIG. 8C, an opening 52b, which passes through the first polysilicon film 28b (first conductor film)/the SiO₂ film 30d (capacitor insulating film), is formed. The first polysilicon film 28b, the lower layer, is exposed at the bottom portion of the opening 52b. Thereafter, a third conductive film, for example, a high melting point metal film 53b such as a W film or a Ti film or the like, is filled in the opening 52b. The first polysilicon film 28b and the second polysilicon film 31b are thereby short-circuited.

In this FLASH EPROM, the second gate portion 33c of the peripheral circuit portion and the first gate portion 33a of the memory cell portion have the same structure. Thus, the peripheral circuit portion can be formed simultaneously with the formation of the memory cell portion. The manufacturing process can thereby be simplified, which is efficient.

Note that, here, the third conductor film 53a or 53b was formed separately from the high melting point metal film (the fourth conductor film) 42. However, they may be formed simultaneously as a common high melting point metal film.

EXAMPLE 3

—Manufacturing of Recording Head—

Example 3 relates to the manufacturing of a recording head as an applied example of the resist pattern of the present invention using the resist pattern thickening material of the present invention. Note that, in Example 3, resist patterns 102 and 126 which will be described hereinafter are resist patterns which have been thickened by the same method as in Example 1 by using the resist pattern thickening material of the present invention.

FIGS. 9A through 9D are process diagrams for explaining the manufacturing of the recording head.

Figure 9A:
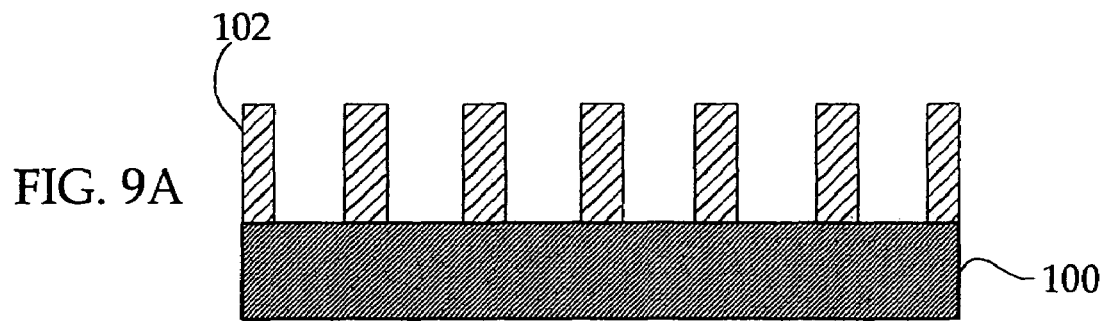
FIGS. 9A to 9D are cross-sectional schematic diagrams for explaining one example in which a resist pattern, which has been thickened by using the resist pattern thickening material of the present invention, is applied to the manufacturing of a recording head.

First, as shown in FIG. 9A, a resist film was formed to a thickness of 6 μm on an interlayer insulating film 100. Exposure and developing were carried out, so as to form the resist pattern 102 having an opening pattern for formation of a spiral, thin film magnetic coil.

Figure 9B:
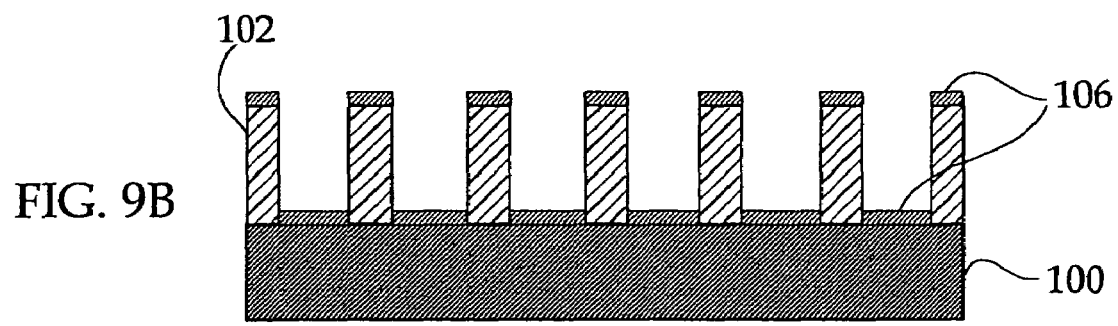

Next, as shown in FIG. 9B, a plating underlying layer 106 was formed by vapor deposition on the interlayer insulating layer 100, both on the resist pattern 102 and on the regions where the resist pattern 102 was not formed, i.e., the exposed surfaces of openings 104. The plating underlying layer 106 was a laminate of a Ti adhering film having a thickness of 0.01 μm and a Cu adhering film having a thickness of 0.05 μm.

Figure 9C:
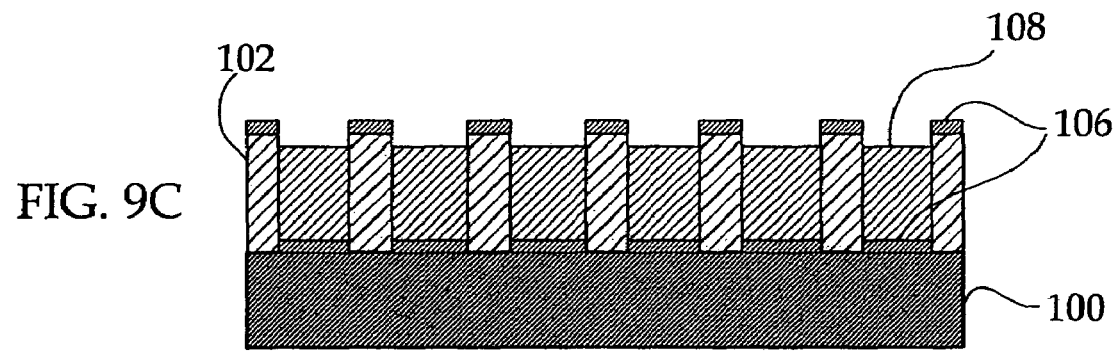

Next, as shown in FIG. 9C, a thin film conductor 108, which was formed by a Cu plating film of a thickness of 3 μm, was formed on the interlayer insulating layer 100, at the regions where the resist pattern 102 was not formed, i.e., on the surfaces of the plating underlying layer 106 formed on the exposed surfaces of the openings 104.

Figure 9D:
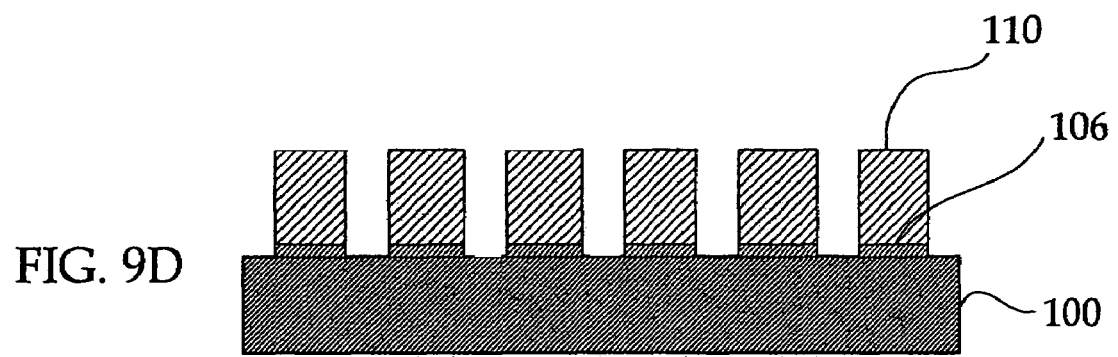

Then, as shown in FIG. 9D, when the resist pattern 102 was melted and removed and lifted off from the interlayer insulating layer 100, a thin film magnetic coil 110, which was formed by the spiral pattern of the thin film conductor 108, was formed.

The recording head was thereby manufactured.

At the obtained recording head, the spiral pattern was formed to be fine by the resist pattern 102 which was thickened by using the thickening material of the present invention. Thus, the thin film magnetic coil 110 was fine and detailed, and was particularly suited to mass production.

FIGS. 10A through 12F are process diagrams for explaining manufacturing of another recording head.

Figure 10A:
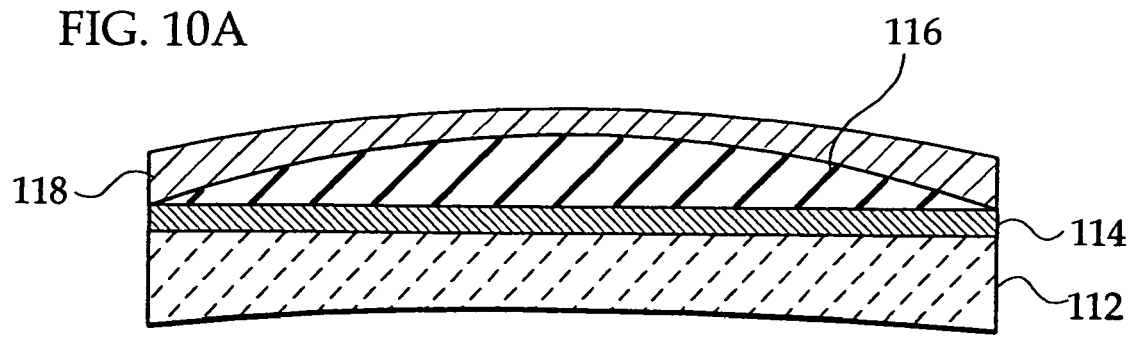
FIGS. 10A to 10B are cross-sectional schematic diagrams for explaining part 1 and 2 of a process of another example in which a resist pattern, which has been thickened by using the resist pattern thickening material of the present invention, is applied to the manufacturing of a recording head.

As shown in FIG. 10A, a gap layer 114 was formed by a sputtering method to cover a non-magnetic substrate 112 formed of ceramic. Note that an insulator layer (not illustrated) formed of silicon oxide and a conductive underlying layer (not illustrated) formed of an Ni—Fe permalloy were formed in advance by a sputtering method to cover the non-magnetic substrate 112, and a lower portion magnetic layer (not illustrated) formed of an Ni—Fe permalloy was additionally formed on the non-magnetic substrate 112. Then, a resin insulating film 116, which was formed by a thermosetting resin, was formed on predetermined regions on the gap layer 114, except for the portions which were to become the magnetic distal end portions of the aforementioned unillustrated lower portion magnetic layer. Next, a resist material was applied onto the resin insulating film 116 so as to form a resist film 118.

Figure 10B:
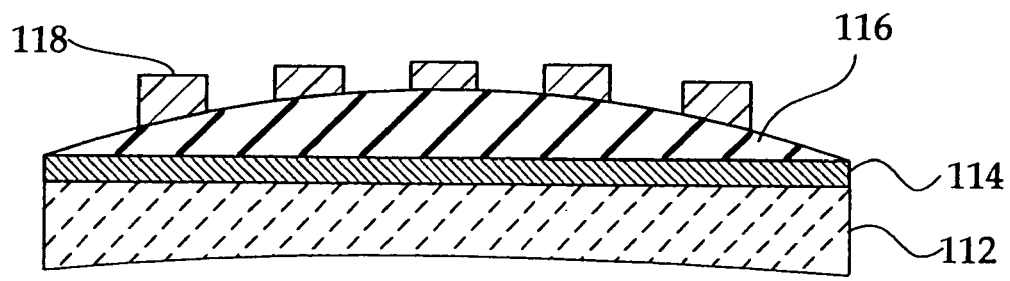

Then, as shown in FIG. 10B, the resist film 118 was exposed and developed, so that a spiral pattern was formed. Subsequently, as shown in FIG. 11C, the resist film 118 of the spiral pattern was subjected to thermosetting processing for about one hour at a temperature of several hundred degrees Celsius, so that a first spiral pattern 120, which was shaped as projections, was formed. Then, a conductive underlying layer 122 formed of Cu was formed to cover the surface of the first spiral pattern 120.

Next, as shown in FIG. 11D, a resist material was applied onto the conductive underlying layer 122 by a spin coating method so as to form a resist film 124. Thereafter, the resist film 124 was patterned on the first spiral pattern 120, so that the resist pattern 126 was formed.

Figure 12E:
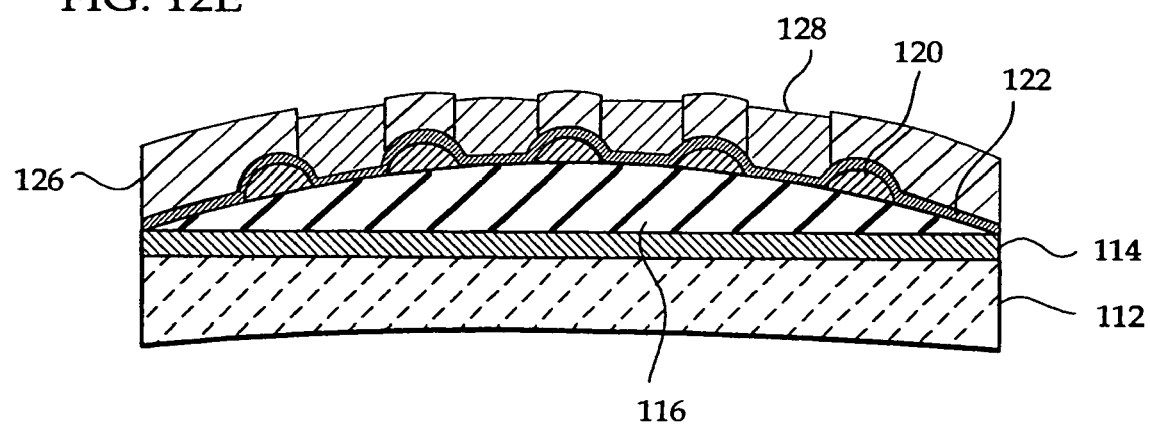
FIGS. 12E to 12F are cross-sectional schematic diagrams for explaining part 5 and 6 of the process of the other example in which the resist pattern, which has been thickened by using the resist pattern thickening material of the present invention, is applied to the manufacturing of the recording head.
Figure 12F:
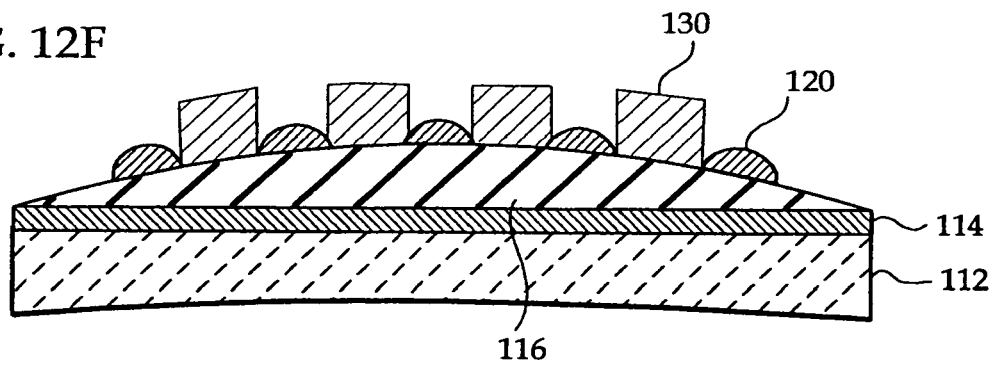

Then, as shown in FIG. 12E, a Cu conductor layer 128 was formed by a plating method on the exposed surface of the conductive underlying layer 122, namely, at the regions where the resist pattern 126 was not formed. Thereafter, as shown in FIG. 12F, by dissolving and removing the resist pattern 126, the resist pattern 126 was lifted-off from the conductive underlying layer 122, so that a spiral, thin film magnetic coil 130 formed of the Cu conductor layer 128 was formed.

Figure 13:
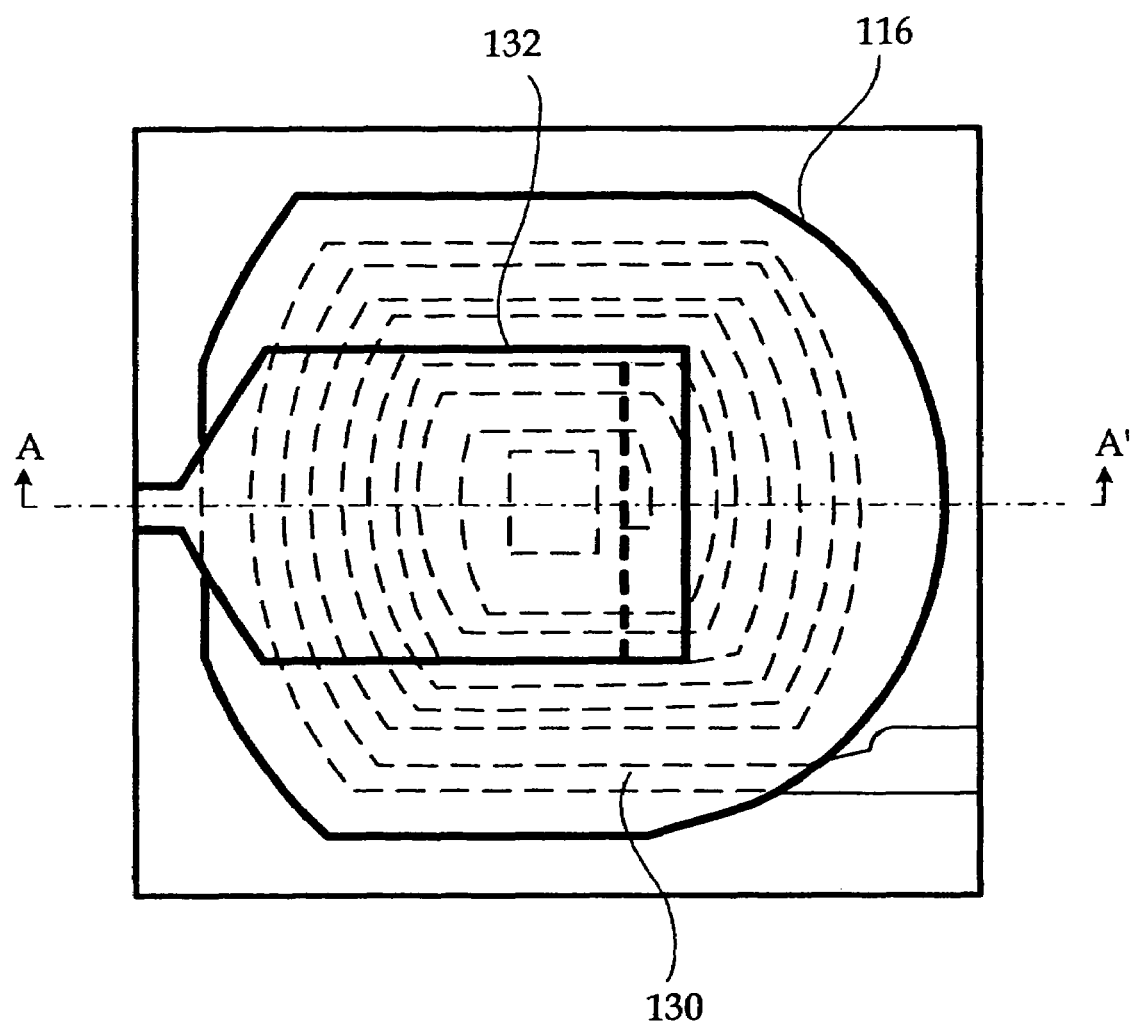
FIG. 13 is a plan view showing one example of the recording head manufactured by the processes of FIGS. 10A through 12F.

In this way, a recording head, such as that shown in plan view in FIG. 13, was manufactured which had a magnetic layer 132 on the resin insulating film 116 and had the thin film magnetic coil 130 on the surface.

At the obtained magnetic head, the spiral pattern was formed to be fine by the resist pattern 126 which was thickened by using the resist pattern thickening material of the present invention. Therefore, the thin film magnetic coil 130 was fine and detailed, and was extremely well suited to mass production.

The present invention provides a resist pattern thickening material which, when applied onto a resist pattern, can efficiently thicken the resist pattern, and which is suited to the formation of a fine space pattern, exceeding the exposure limits of light sources of existing exposure devices.

Further, the present invention provides a process for forming a resist pattern which, when patterning a resist pattern, can utilize, as is, light sources (such as ArF excimer laser light or the like) of existing exposure devices, and which has excellent mass productivity, and which can form a space pattern finely, exceeding the exposure limits of such light sources. The present invention also provides a resist pattern formed by this process for forming a resist pattern.

The present invention also provides a process for manufacturing a semiconductor device which, by using a space pattern which has been formed to be fine, can form a fine pattern on an underlying layer which is an oxide film or the like, and which can efficiently mass produce high-performance semiconductor devices having fine wiring and the like. The present invention also provides a high-performance semiconductor device manufactured by this process for manufacturing a semiconductor device.

What is claimed is:

1. A resist pattern thickening material comprising:
    a resin;
    a crosslinking agent; and
    at least one of a cationic surfactant, an amphoteric surfactant, and a non-ionic surfactant selected from an, a lauryl alcohol ethoxylate surfactant, an oleyl alcohol ethoxylate surfactant, a secondary alcohol ethoxylate surfactant, a fatty acid ester surfactant, an amide surfactant, an alcohol surfactant, and an ethylene diamine surfactant, wherein the surfactant does not contain acetylene bonding, and wherein the surfactant is included at an amount of 1.25 to 2.5 weight parts with respect to 100 weight parts of the resin,
    wherein the resist pattern thickening material is capable of thickening a resist pattern of an ArF resist.

2. A resist pattern thickening material according to claim 1, wherein the cationic surfactant is at least one of an alkyl cationic surfactant, an amide quaternary cationic surfactant, and an ester quaternary cationic surfactant.

3. A resist pattern thickening material according to claim 1, wherein the amphoteric surfactant is at least one of an aminoxide surfactant and a betaine surfactant.

4. A resist pattern thickening material according to claim 1, wherein the resist pattern thickening material has at least one of water-solubility and alkali-solubility.

5. A resist pattern thickening material according to claim 1, wherein the resin is at least one of polyvinyl alcohol, polyvinyl acetal, and polyvinyl acetate.

6. A resist pattern thickening material according to claim 1, wherein the resin contains polyvinyl acetal in an amount of 5% by mass to 40% by mass.

7. A resist pattern thickening material according to claim 1, wherein the crosslinking agent is at least one of a melamine derivative, a urea derivative, and an uril derivative.

8. A resist pattern thickening material according to claim 1, further comprising a water-soluble aromatic compound.

9. A resist pattern thickening material according to claim 8, wherein a solubility of the water-soluble aromatic compound is 1 g or more thereof in 100 g of water of 25° C.

10. A resist pattern thickening material according to claim 8, wherein the water-soluble aromatic compound has at least two polar groups.

11. A resist pattern thickening material according to claim 10, wherein the polar groups are each independently selected from hydroxyl groups, carboxyl groups, and carbonyl groups.

12. A resist pattern thickening material according to claim 8, wherein the water-soluble aromatic compound is at least one of a polyphenol compound, an aromatic carboxylic acid compound, a naphthalene polyhydroxy compound, a benzophenone compound, a flavonoid compound, a derivative thereof, and a glycoside thereof.

13. A resist pattern thickening material according to claim 1, further comprising a resin containing an aromatic compound in a portion thereof.

14. A resist pattern thickening material according to claim 13, wherein the resin containing an aromatic compound in a portion thereof is at least one of a polyvinyl aryl acetal resin, a polyvinyl aryl ether resin, and a polyvinyl aryl ester resin.

15. A resist pattern thickening material according to claim 13, wherein the aromatic compound in the resin containing an aromatic compound in a portion thereof has at least one functional group of a hydroxyl group, an amino group, a sulfonyl group, a carboxyl group, and a derivative thereof.

16. A resist pattern thickening material according to claim 13, wherein the resin containing an aromatic compound in a portion thereof has an acetyl group.

17. A resist pattern thickening material according to claim 13, wherein a molar content of the aromatic compound in the resin containing an aromatic compound in a portion thereof is 5 mol % or more.

18. A resist pattern thickening material according to claim 1, further comprising an organic solvent.

19. A resist pattern thickening material according to claim 18, wherein the organic solvent is at least one of an alcohol solvent, a chain ester solvent, a cyclic ester solvent, a ketone solvent, a chain ether solvent, and a cyclic ether solvent.

20. A resist pattern comprising:
    a resist pattern thickening material to cover a surface of a resist pattern of an ArF resist so as to thicken the resist pattern,
    wherein the resist pattern thickening material is applied onto the resist pattern of an ArF resist after forming the resist pattern, and the resist pattern thickening material comprises:
    a resin;
    a crosslinking agent; and
    at least one of a cationic surfactant, an amphoteric surfactant, and a non-ionic surfactant selected from an, a lauryl alcohol ethoxylate surfactant, an oleyl alcohol ethoxylate surfactant, a secondary alcohol ethoxylate surfactant, a fatty acid ester surfactant, an amide surfactant, an alcohol surfactant, and an ethylene diamine surfactant, wherein the surfactant does not contain acetylene bonding, and wherein the surfactant is included at an amount of 1.25 to 2.5 weight parts with respect to 100 weight parts of the resin.

21. A resist pattern according to claim 20, wherein a material of the resist pattern is at least one of a novolak resist, a polyhydroxystyrene (PHS) resist, an acrylic resist, a cycloolefin-maleic acid anhydride resist, a cycloolefin resist, and a cycloolefin-acryl hybrid resist.

22. A process for forming a resist pattern, comprising:
    applying a resist pattern thickening material onto a resist pattern pattern of an ArF resist, to cover a surface of the resist pattern, after forming the resist pattern to be thickened, so as to thicken the resist pattern,
    wherein the resist pattern thickening material comprises:
    a resin;
    a crosslinking agent; and
    at least one of a cationic surfactant, an amphoteric surfactant, and a non-ionic surfactant selected from an, a lauryl alcohol ethoxylate surfactant, an oleyl alcohol ethoxylate surfactant, a secondary alcohol ethoxylate surfactant, a fatty acid ester surfactant, an amide surfactant, an alcohol surfactant, and an ethylene diamine surfactant, wherein the surfactant does not contain acetylene bonding, and wherein the surfactant is included at an amount of 1.25 to 2.5 weight parts with respect to 100 weight parts of the resin.

23. A process for forming a resist pattern according to claim 22, wherein a developing process is carried out after the step of applying the resist pattern thickening material.

24. A process for forming a resist pattern according to claim 23, wherein the developing process is carried out by using pure water.

25. A semiconductor device comprising:
a pattern formed by using a resist pattern pattern of an ArF resist thickened by a resist pattern thickening material, wherein the resist pattern thickening material comprises:
a resin;
a crosslinking agent; and
at least one of a cationic surfactant, an amphoteric surfactant, and a non-ionic surfactant selected from an, a lauryl alcohol ethoxylate surfactant, an oleyl alcohol ethoxylate surfactant, a secondary alcohol ethoxylate surfactant, a fatty acid ester surfactant, an amide surfactant, an alcohol surfactant, and an ethylene diamine surfactant, wherein the surfactant does not contain acetylene bonding, and wherein the surfactant is included at an amount of 1.25 to 2.5 weight parts with respect to 100 weight parts of the resin.

26. A process for manufacturing a semiconductor device comprising:
applying a resist pattern thickening material to cover a surface of a resist pattern pattern of an ArF resist, after forming the resist pattern on an underlying layer, so as to thicken the resist pattern and form a resist pattern; and
etching the underlying layer using the resist pattern as a mask so as to pattern the underlying layer,
wherein the resist pattern thickening material comprises:
a resin;
a crosslinking agent; and
at least one of a cationic surfactant, an amphoteric surfactant, and a non-ionic surfactant selected from an, a lauryl alcohol ethoxylate surfactant, an oleyl alcohol ethoxylate surfactant, a secondary alcohol ethoxylate surfactant, a fatty acid ester surfactant, an amide surfactant, an alcohol surfactant, and an ethylene diamine surfactant, wherein the surfactant does not contain acetylene bonding, and wherein the surfactant is included at an amount of 1.25 to 2.5 weight parts with respect to 100 weight parts of the resin.

27. A process for manufacturing a semiconductor device according to claim 26, further comprising:
applying a surfactant on the surface of the resist pattern to be thickened, before the step of applying the resist pattern thickening material.

28. A resist pattern thickening material comprising:
a resin;
a crosslinking agent; and
a surfactant,
wherein the resin is a polyvinyl alcohol;
the crosslinking agent is an uril derivative; and
the surfactant is any one selected from: a secondary alcohol ethoxylate surfactant, a sorbitan fatty acid ester compound, a natural alcohol surfactant, a primary alcohol ethoxylate surfactant, an ethylene diamine surfactant, an ester cationic surfactant, an amine oxide surfactant, a betaine surfactant and a higher alcohol surfactant,
wherein the surfactant does not contain acetylene bonding and wherein the surfactant is included at an amount of 1.25 to 2.5 weight parts with respect to 100 weight parts of the resin, and
wherein the resist pattern thickening material is capable of thickening a resist pattern of an ArF resist.

29. A resist pattern thickening material comprising:
a resin;
a crosslinking agent; and
a surfactant,
wherein the resin is a polyvinyl alcohol;
the crosslinking agent is an urea derivative; and
the surfactant is any one selected from a nonylphenol ethoxylate surfactant and an amide surfactant,
wherein the surfactant does not contain acetylene bonding, and wherein the surfactant is included at an amount of 1.25 to 2.5 weight parts with respect to 100 weight parts of the resin, and
wherein the resist pattern thickening material is capable of thickening a resist pattern of an ArF resist.

30. A resist pattern thickening material comprising;
a resin;
a crosslinking agent; and
a surfactant,
wherein the resin is a polyvinyl alcohol;
the crosslinking agent is a melamine derivative; and
the surfactant is a special phenol ethoxylate,
wherein the surfactant does not contain acetylene bonding and wherein the surfactant is included at an amount of 1.25 to 2.5 weight parts with respect to 100 weight parts of the resin, and
wherein the resist pattern thickening material is capable of thickening a resist pattern of an ArF resist.

31. A resist pattern thickening material comprising:
a resin;
a crosslinking agent; and
a surfactant,
wherein the resin is a polyvinyl acetal;
the crosslinking agent is an uril derivative; and
the surfactant is any one selected from: a secondary alcohol ethoxylate surfactant, a sorbitan fatty acid ester compound, a natural alcohol surfactant, a primary alcohol ethoxylate surfactant, an ethylene diamine surfactant, art ester cationic surfactant, an amine oxide surfactant, a betaine surfactant and a higher alcohol surfactant;
wherein the surfactant does not contain acetylene bonding and wherein the surfactant is included at an amount of 1.25 to 2.5 weight parts with respect to 100 weight parts of the resin,
wherein the resist pattern thickening material is capable of thickening a resist pattern, and
wherein the resist pattern thickening material is applied to an ArF resist.

32. A resist pattern thickening material comprising:
a resin;
a crosslinking agent; and
a surfactant,
wherein the resin is a polyvinyl acetal;
the crosslinking agent is an urea derivative; and
the surfactant is any one selected from a nonylphenol ethoxylate surfactant and an amide surfactant,
wherein the surfactant does not contain acetylene bonding and wherein the surfactant is included at an amount of 1.25 to 2.5 weight parts with respect to 100 weight parts of the resin,
wherein the resist pattern thickening material is capable of thickening a resist pattern, and
wherein the resist pattern thickening material is applied to an ArF resist.

33. A resist pattern thickening material comprising:
a resin;
a crosslinking agent; and
a surfactant, wherein the resin is a polyvinyl acetal;
the crosslinking agent is a melamine derivative; and
the surfactant is a special phenol ethoxylate,
wherein the surfactant does not contain acetylene bonding and wherein the surfactant is included at an amount of 1.25 to 2.5 weight parts with respect to 100 weight parts of the resin,
wherein the resist pattern thickening material is capable of thickening a resist pattern, and
wherein the resist pattern thickening material is applied to an ArF resist.

34. A resist pattern thickening material comprising:
a resin;
a crosslinking agent;
a surfactant; and
a water-soluble aromatic compound,
wherein the resin is a polyvinyl acetal;
the crosslinking agent is an uril derivative;
the surfactant is a secondary alcohol ethoxylate surfactant; and
the water-soluble aromatic compound is a resorcinol,
wherein the surfactant does not contain acetylene bonding and wherein the surfactant is included at an amount of 1.25 to 2.5 weight parts with respect to 100 weight parts of the resin,
wherein the resist pattern thickening material is capable of thickening a resist pattern, and
wherein the resist pattern thickening material is applied to an ArF resist.

35. A resist pattern thickening material comprising:
a resin;
a crosslinking agent;
a surfactant; and
a water-soluble aromatic compound,
wherein the resin is a polyvinyl acetal;
the crosslinking agent is an uril derivative;
the surfactant is a natural alcohol surfactant; and
the water-soluble aromatic compound is a catechin,
wherein the surfactant does not contain acetylene bonding and wherein the surfactant is included at an amount of 1.25 to 2.5 weight parts with respect to 100 weight parts of the resin,
wherein the resist pattern thickening material is capable of thickening a resist pattern, and
wherein the resist pattern thickening material is applied to an ArF resist.

* * * * *